(12) United States Patent
Milbar

(10) Patent No.: US 9,219,573 B2
(45) Date of Patent: Dec. 22, 2015

(54) SYSTEM AND METHOD FOR RECOVERING AUDIO PDU TRANSPORT ELEMENTS IN DIGITAL RADIO BROADCAST RECEIVER

(71) Applicant: iBiquity Digital Corporation, Columbia, MD (US)

(72) Inventor: Marek Milbar, Huntingdon Valley, PA (US)

(73) Assignee: iBiquity Digital Corporation, Columbia, MD (US)

(*) Notice: Subject to any disclaimer, the term of this patent is extended or adjusted under 35 U.S.C. 154(b) by 231 days.

(21) Appl. No.: 13/843,956

(22) Filed: Mar. 15, 2013

(65) Prior Publication Data

US 2014/0281835 A1   Sep. 18, 2014

(51) Int. Cl.
| | |
|---|---|
| H04L 1/00 | (2006.01) |
| H03M 13/00 | (2006.01) |
| H04H 60/11 | (2008.01) |
| H03M 13/09 | (2006.01) |
| H03M 13/33 | (2006.01) |

(52) U.S. Cl.
CPC ............. *H04L 1/0045* (2013.01); *H03M 13/09* (2013.01); *H03M 13/333* (2013.01); *H04H 60/11* (2013.01); *H04H 2201/18* (2013.01)

(58) Field of Classification Search
None
See application file for complete search history.

(56) References Cited

U.S. PATENT DOCUMENTS

| | | | | |
|---|---|---|---|---|
| 7,068,998 B2* | 6/2006 | Zavidniak | ................. | 455/410 |
| 7,864,815 B2* | 1/2011 | Lin et al. | ................. | 370/509 |
| 2008/0002567 A1 | 1/2008 | Bourlas et al. | | |
| 2008/0130686 A1 | 6/2008 | Milbar | | |
| 2009/0128323 A1 | 5/2009 | Milbar | | |
| 2009/0163137 A1 | 6/2009 | Capparelli et al. | | |
| 2010/0166122 A1 | 7/2010 | Pahuja et al. | | |
| 2011/0026640 A1 | 2/2011 | Milbar | | |
| 2014/0331111 A1* | 11/2014 | Kroeger et al. | ............... | 714/807 |

OTHER PUBLICATIONS

Ibiquity Digital Corporation, HD Radio™ Air Interface Design Description Audio Transport, Rev. F, Dec. 6, 2007.
Ibiquity Digital Corporation, HD Radio™ Air Interface Design Description Audio Transport, Rev. G, Aug. 23, 2011.
Ibiquity Digital Corporation, HD Radio™ Air Interface Design Description Advanced Application Services Transport, Rev. G, Aug. 23, 2011.
International Search Report and Written Opinion for PCT Application No. PCT/US2014/027657, dated Jun. 30, 2014.
International Preliminary Report on Patentability for PCT Application No. PCT/US2014/027657, dated Sep. 15, 2015.

* cited by examiner

*Primary Examiner* — Justin R Knapp
(74) *Attorney, Agent, or Firm* — Terrile, Cannatti,Chambers & Holland, LLP; Michael Rocco Cannatti

(57) ABSTRACT

A method and apparatus are provided for recovering audio packet location fields and/or frame boundary information from a received digital radio broadcast signal frame in which there are detected errors in the signal frame header by using selected header elements and/or protocol data unit (PDU) structured data block parameters relating to minimum, maximum, and average packet length or PDU length in a scalable recovery process that may be throttled dynamically or configured statically based on available computation resources within a specific implementation and/or at a specific time.

26 Claims, 15 Drawing Sheets

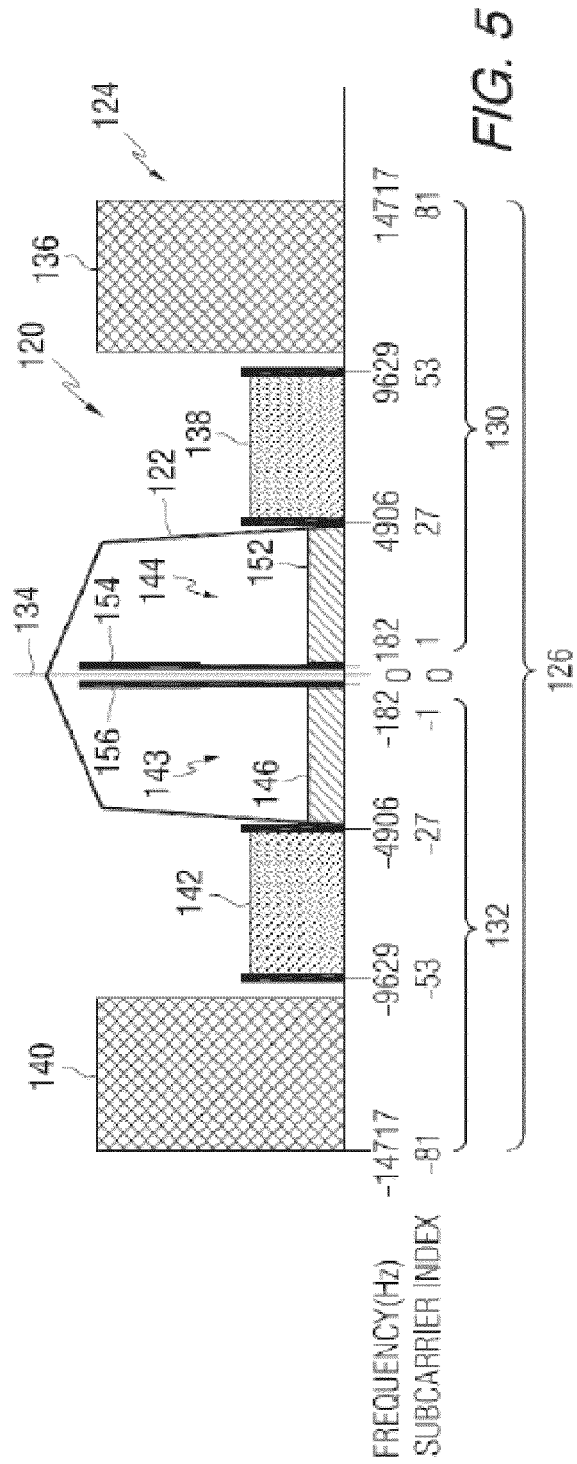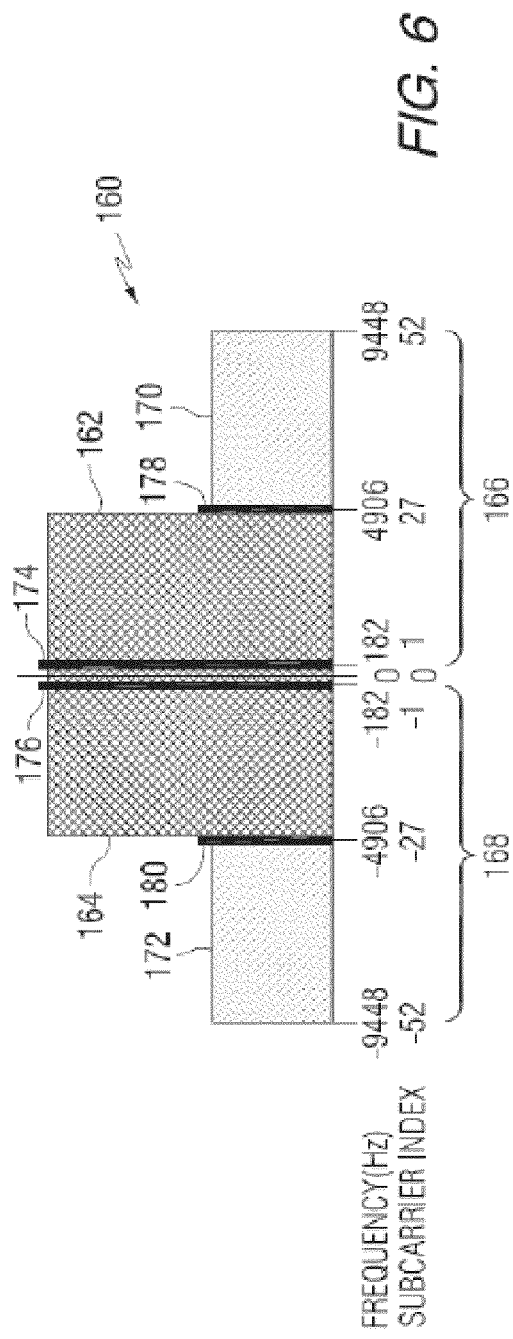

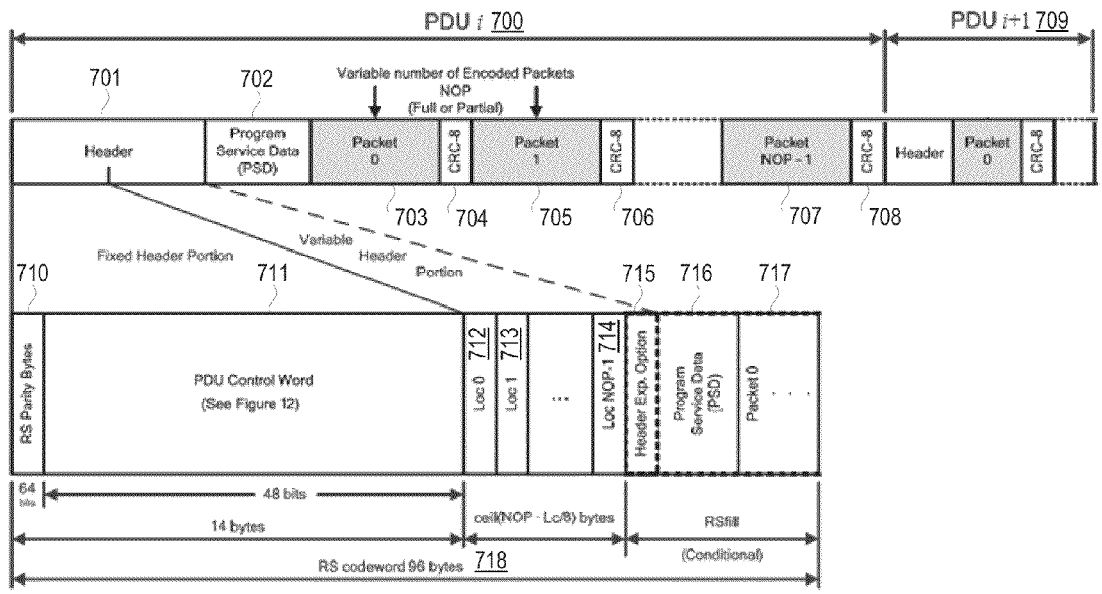
Figure 11
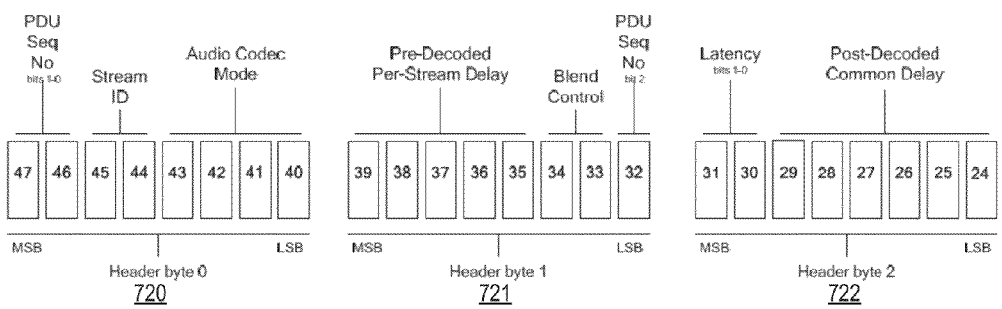
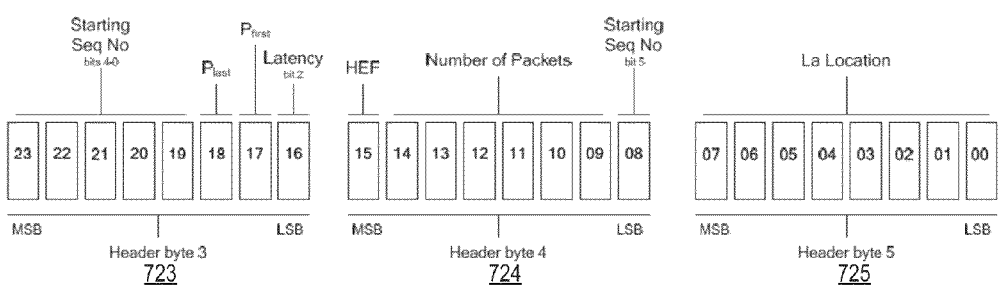
Figure 12

SYSTEM AND METHOD FOR RECOVERING AUDIO PDU TRANSPORT ELEMENTS IN DIGITAL RADIO BROADCAST RECEIVER

BACKGROUND OF THE INVENTION

1. Field of the Invention

The present invention is directed in general to digital radio broadcast receivers and methods for operating same. In one aspect, the present invention relates to methods and apparatus for recovering digital signal information at a radio receiver.

2. Description of the Related Art

Digital radio broadcasting technology delivers digital audio and data services to mobile, portable, and fixed receivers using existing radio bands. One type of digital radio broadcasting, referred to as in-band on-channel (IBOC) digital radio broadcasting, transmits digital radio and analog radio broadcast signals simultaneously on the same frequency using digitally modulated subcarriers or sidebands to multiplex digital information on an AM or FM analog modulated carrier signal. HD Radio™ technology, developed by iBiquity Digital Corporation, is one example of an IBOC implementation for digital radio broadcasting and reception. With IBOC digital radio broadcasting, signals can be transmitted in a hybrid format including an analog modulated carrier in combination with a plurality of digitally modulated carriers or in an all-digital format wherein the analog modulated carrier is not used. In the hybrid mode, broadcasters may continue to transmit analog AM and FM simultaneously with higher-quality and more robust digital signals, allowing themselves and their listeners to convert from analog-to-digital radio while maintaining their current frequency allocations. Another feature of IBOC digital radio broadcasting is the digital transmission capability to simultaneously transmit both digitized audio and data so that one or more digital audio programs can be broadcast within a single logical channel, alone or in combination with wireless data messages, such as metadata (e.g., the artist, song title, or station call letters), special messages (e.g., event, news, traffic, and weather information), or other message information that can all be scrolled across a radio receiver's display while the user listens to a radio station. Of course, with any wireless or radio-based communication system, there are potential signal errors and distortions that arise from the adverse channel conditions which can affect or disrupt signal detection at the receiver. While error detection and correction mechanisms can be used in the signal decoding process, such mechanisms typically do not provide the ability to recover transport elements within a frame (e.g., packet boundaries within the frame) if there are errors in the frame header. As a result, digital signal decoding errors can result in prolonged signal blending from digital to either analog signal or to silence. Accordingly, the present inventor has found that a need exists for improved method and apparatus for processing the digital audio signals to overcome the problems in the art, such as outlined above. Further limitations and disadvantages of conventional processes and technologies will become apparent to one of skill in the art after reviewing the remainder of the present application with reference to the drawings and detailed description which follow.

BRIEF SUMMARY OF TILE INVENTION

Embodiments of the present disclosure are directed to a signal reception method, system and/or apparatus that may overcome the limitations and disadvantages of conventional processes and technologies by using a plurality of predetermined signal parameters to recover or salvage audio transport elements from a received digital radio broadcast signal frame in which there are detected errors in the signal frame header or within individual packets of the signal frame. In selected embodiments of the present disclosure, a processor-implemented method and apparatus are provided for recovering audio packets and/or frame boundary information in a protocol data unit (PDU) structured data block or in consecutive PDU structured data blocks in the cases where the PDU header detection fails but other PDU elements have limited signal errors. In operation, the recovery process may be implemented when the PDU header decoding process fails by identifying valid and invalid audio packet location fields in the PDU header using selected PDU parameters relating to minimum, maximum, and average packet length or PDU length to extract locator information from an expected placement in the PDU header. In addition, the recovery process may be used to recover a PDU boundary by using the audio packet location field(s) in a first PDU to identify a predetermined synchronization pattern in one or more subsequent consecutive PDUs within the same transfer frame. In other embodiments of the present disclosure, the processor-implemented method and apparatus may be implemented with a scalable recover process that may be throttled dynamically or configured statically based on available computation resources within a specific implementation and/or at a specific time. In this way, one or more audio packets, or even consecutive PDUs, can be recovered from a received digital radio broadcast signal frame in which header decoding fails in a first PDU header, thereby improving the quality of the received digital signal and avoiding prolonged blending from digital to either analog signal or to silence.

BRIEF DESCRIPTION OF THE DRAWINGS

These and other features, aspects, and advantages of the present disclosure will become better understood with regard to the following description, appended claims, and accompanying drawings wherein:

FIG. 5 is a schematic representation of a hybrid AM IBOC waveform;

FIG. 6 is a schematic representation of an all-digital AM IBOC waveform;

FIG. 11 illustrates an exemplary PDU frame format structure for broadcasting audio packets in an IBOC digital radio signal;

FIG. 12 illustrates an exemplary PDU control word structure with example bit allocations in a plurality of control word bytes;

DETAILED DESCRIPTION

Figure 1:
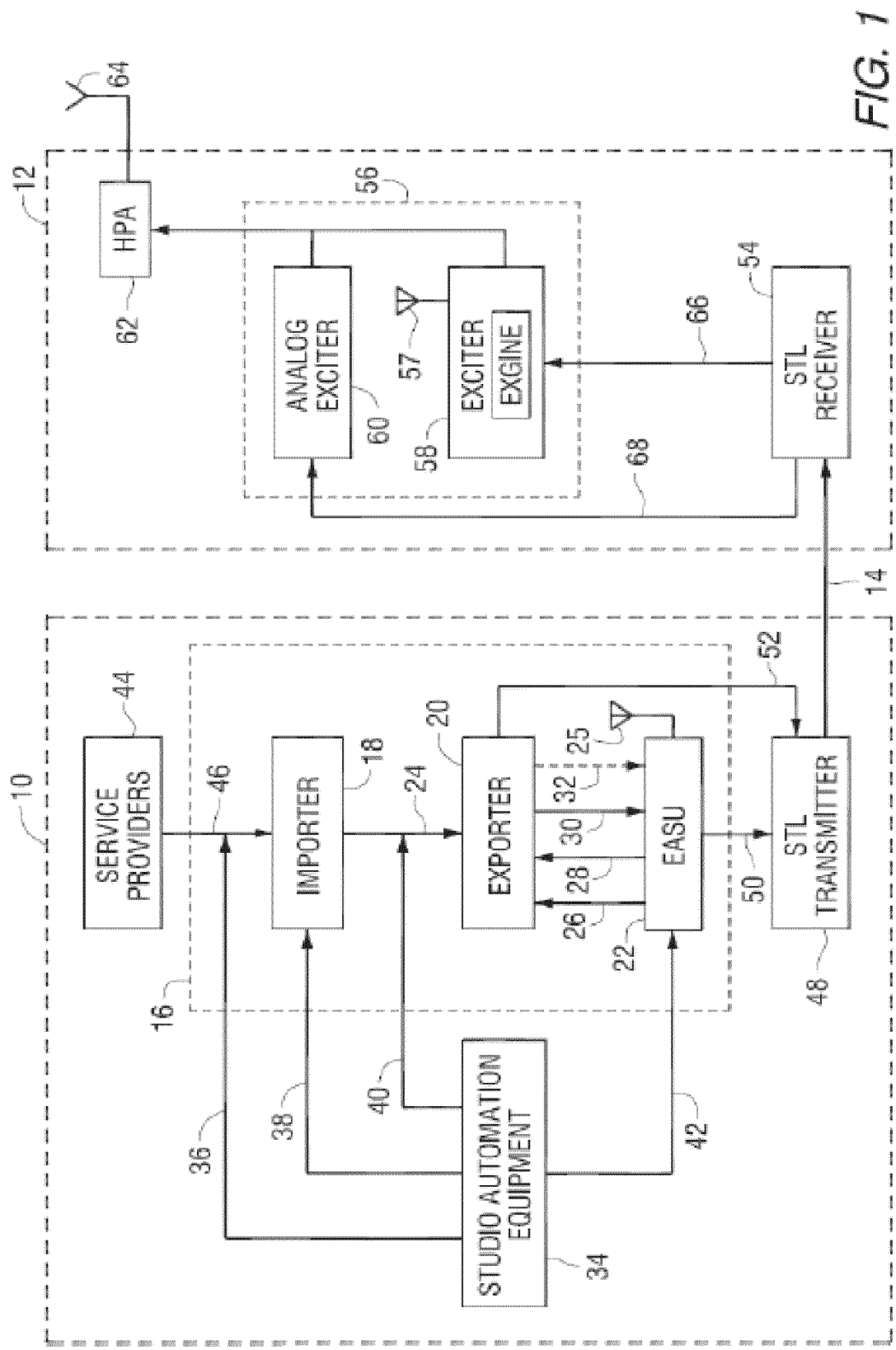
FIG. 1 illustrates a block diagram that provides an overview of a system in accordance with certain embodiments.

A digital radio broadcast receiver apparatus and associated method(s) for operating same are described for using a plurality of predetermined signal parameters to efficiently recover or salvage audio transport elements (e.g., audio packet location fields and/or frame boundary information) from a received digital radio broadcast signal frame in which there are detected errors in the signal frame header. To reduce or prevent blending to a low bandwidth audio signal (analog audio) when frame header errors are detected in a received digital signal, a digital audio packet recovery process uses selected header elements and/or related protocol data unit (PDU) structured data block parameters relating to minimum, maximum, and average packet length or PDU length to extract audio packet location fields from an expected placement in the PDU header and identify valid and invalid audio packet location fields in the PDU header. The recovery process may also identify PDU boundary information by using the audio packet location field(s) in a first PDU to identify a predetermined synchronization pattern in one or more subsequent consecutive PDUs within the same transfer frame. In other embodiments, the recovery process may be throttled dynamically or configured statically based on available computation resources within a specific implementation and/or at a specific time. In this way, one or more audio packets, or even consecutive PDUs, can be recovered from a received digital radio broadcast signal frame in which header decoding fails in a first PDU header, thereby improving the quality of the received digital signal and avoiding prolonged blending to either analog signal or to silence.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Some portions of the detailed descriptions provided herein are presented in terms of algorithms and instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

FIGS. 1-10 and the accompanying description herein provide a general description of an exemplary IBOC system, exemplary broadcasting equipment structure and operation, and exemplary receiver structure and operation, FIGS. 11-16 and the accompanying description herein provide a detailed description of exemplary approaches for recovering audio PDU elements in a digital radio broadcast receiver in accordance with exemplary embodiments of the present disclosure. Whereas aspects of the disclosure are presented in the context of an exemplary IBOC system, it should be understood that the present disclosure is not limited to IBOC systems and that the teachings herein are applicable to other forms of digital radio broadcasting as well.

As referred to herein, a service is any analog or digital medium for communicating content via radio frequency broadcast. For example, in an IBOC radio signal, the analog modulated signal, the digital main program service, and the digital supplemental program services could all be considered services. Other examples of services can include conditionally accessed programs (CAs), which are programs that require a specific access code and can be audio such as, for example, a broadcast of a game or a concert. Additional examples of services can include data services such as, for example, a traffic update service, multimedia and other files, and program service guides (EPGs). A service identifier as referred to herein refers to a particular service. For example, if an analog modulated signal is centered at 94.1 MHz, then a service identifier could refer to the radio frequency of 94.1 MHz. Additionally, the same broadcast in IBOC digital radio broadcasting can include a number of supplemental audio and data services and each could have its own service identifier. Also, a data unit may refer to individual bits, nibbles, bytes, or any other unit of data.

Referring now to FIG. 1, there is shown a functional block diagram of exemplary components of a studio site 10, an FM transmitter site 12, and a studio transmitter link (STL) 14 that can be used to broadcast an FM IBOC digital radio broadcasting signal. The studio site 10 includes, among other things, studio automation equipment 34, an Ensemble Operations Center (EOC) 16 that includes an importer 18, an exporter 20, and an exciter auxiliary service unit (EASU) 22. An STL transmitter 48 links the EOC 16 with the transmitter site 12. The depicted transmitter site 12 includes an STL receiver 54, an exciter 56 that includes an exciter engine (engine) subsystem 58, and an analog exciter 60. While the exporter 20 is shown in FIG. 1 as residing at a radio station's studio site 10 and the exciter 60 is located at the transmission site 12, these elements may be co-located at the transmission site 12.

At the studio site 10, the studio automation equipment 34 supplies main program service (MPS) audio 42 to the EASU 22, MPS data 40 to the exporter 20, supplemental program service (SPS) audio 38 to the importer 18, and SPS data 36 to the importer 18. MPS audio serves as the main audio programming source. In hybrid modes, preserves the existing analog radio programming formats in both the analog and digital transmissions. MPS data or SPS data, also known as program service data (PSD), includes information such as music title, artist, album name, etc. Supplemental program service can include supplementary audio content as well as program service data.

The importer 18 contains hardware and software for supplying advanced application services (AAS). AAS can include any type of data that is not classified as MPS, SPS, or Station Information Service (SIS). SIS provides station information, such as call sign, absolute time, position correlated to GPS, etc. Examples of AAS include data services for electronic program guides, navigation maps, real-time traffic and weather information, multimedia applications, other audio services, and other data content. The content for AAS can be supplied by service providers 44, which provide service data 46 to the importer via an application program interface (API). The service providers may be a broadcaster located at the studio site or externally sourced third-party providers of services and content. The importer can establish session connections between multiple service providers. The importer encodes and multiplexes service data 46, SPS audio 38, and SPS data 36 to produce exporter link data 24, which is output to the exporter via a data link. As part of the AAS, the importer also encodes a Service Information Guide (SIG), in which it typically identifies and describes services. For example, the SIG may include data identifying the genre of the services available on the current frequency (e.g., the genre of MPS audio and any SPS audio).

The exporter 20 contains the hardware and software necessary to supply the main program service and SIS for broadcasting. The exporter accepts digital MPS audio 26 over an audio interface and compresses the audio. The exporter also multiplexes MPS data 40, exporter link data 24, and the compressed digital MPS audio to produce exciter link data 52. In addition, the exporter accepts analog MPS audio 28 over its audio interface and applies a pre-programmed delay to it to produce a delayed analog MPS audio signal 30. This analog audio can be broadcast as a backup channel for hybrid IBOC digital radio broadcasting broadcasts. The delay compensates for the system delay of the digital MPS audio, allowing receivers to blend between the digital and analog program without a shift in time. In an AM transmission system, the delayed MPS audio signal 30 is converted by the exporter to a mono signal and sent directly to the SU, as part of the exciter link data 52.

The EASU 22 accepts MPS audio 42 from the studio automation equipment 34, rate converts it to the proper system clock, and outputs two copies of the signal, one digital (26) and one analog (28). The EASU 22 includes a GPS receiver that is connected to an antenna 25. The GPS receiver allows the EASU to derive a master clock signal, which is synchronized to the exciter's clock by use of GPS units. The EASU provides the master system clock used by the exporter. The EASU is also used to bypass (or redirect) the analog MPS audio from being passed through the exporter in the event the exporter has a catastrophic fault and is no longer operational. The bypassed audio 32 can be fed directly into the STL transmitter, eliminating a dead-air event.

STL transmitter 48 receives delayed analog MPS audio 50 and exciter link data 52. It outputs exciter link data and delayed analog MPS audio over STL link 14, which may be either unidirectional or bidirectional. The STL, link 14 may be a digital microwave or Ethernet link, for example, and may use the standard User Datagram Protocol or the standard TCP/IP.

The transmitter site 12 includes an STL receiver 54, an exciter engine (exgine) 56 and an analog exciter 60. The STL receiver 54 receives exciter link data, including audio and data signals as well as command and control messages, over the STL link 14. The exciter link data is passed to the exciter 56, which produces the IBOC digital radio broadcasting waveform. The exciter includes a host processor, digital up-converter, RE up-converter, and exgine subsystem 58. The exgine accepts exciter link data and modulates the digital portion of the IBOC digital radio broadcasting waveform. The digital up-converter of exciter 56 converts from digital-to-analog the baseband portion of the engine output. The digital-to-analog conversion is based on a GPS clock, common to that of the exporter's GPS-based clock derived from the EASU. Thus, the exciter 56 includes a GPS unit and antenna 57. An alternative method for synchronizing the exporter and exciter clocks can be found in U.S. Pat. No. 7,512,175, the disclosure of which is hereby incorporated by reference in its entirety. The RF up-converter of the exciter up-converts the analog signal to the proper in-band channel frequency. The up-converted signal is then passed to the high power amplifier 62 and antenna 64 for broadcast. In an AM transmission system, the exgine subsystem coherently adds the backup analog MPS audio to the digital waveform in the hybrid mode; thus, the AM transmission system does not include the analog exciter 60. In addition, in an AM transmission system, the exciter 56 produces phase and magnitude information and the analog signal is output directly to the high power amplifier.

IBOC digital radio broadcasting signals can be transmitted in both AM and FM radio bands, using a variety of waveforms. The waveforms include an FM hybrid IBOC digital radio broadcasting waveform, an FM all-digital IBOC digital radio broadcasting waveform, an AM hybrid IBOC digital radio broadcasting waveform, and an AM all-digital IBOC digital radio broadcasting waveform.

Figure 2:
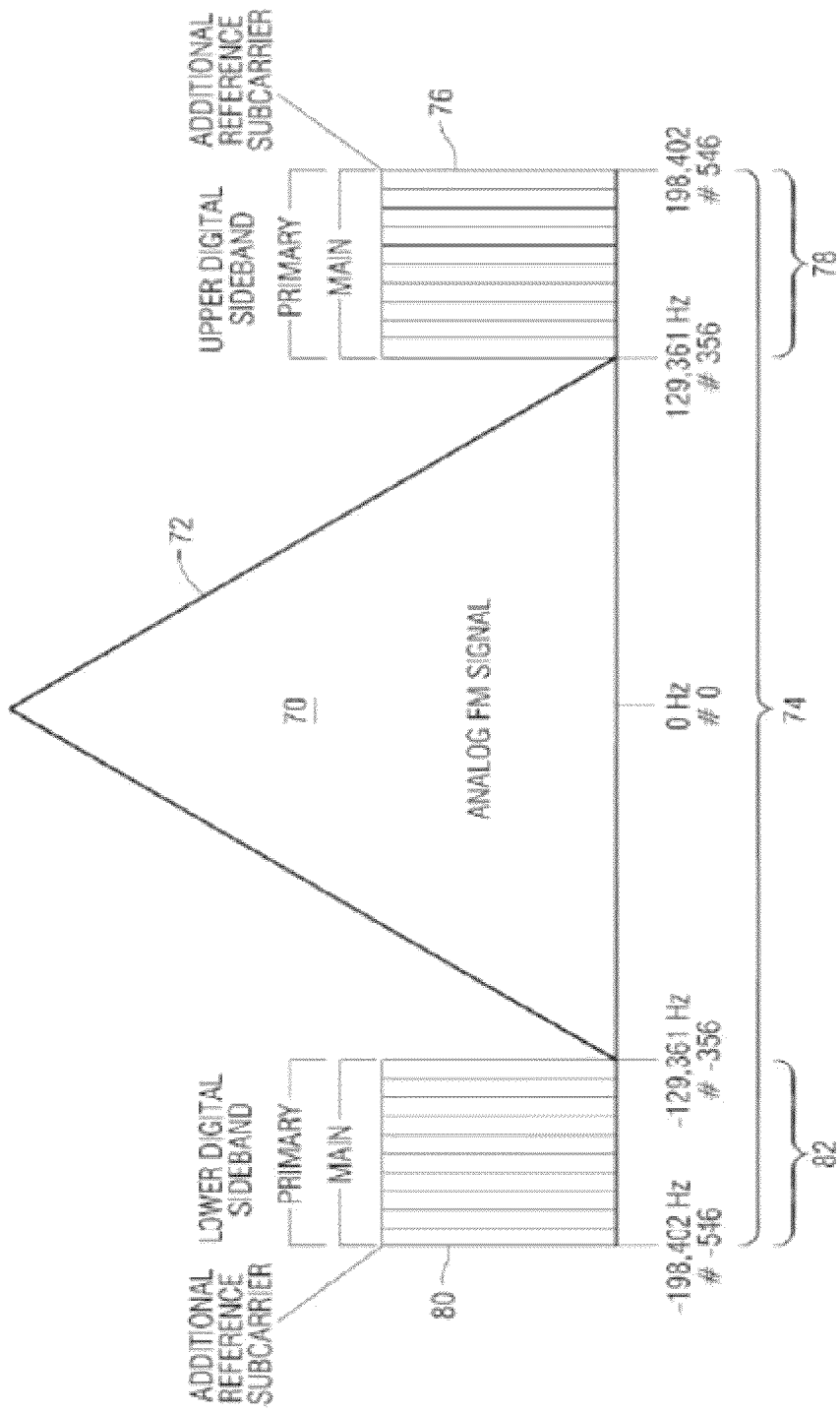
FIG. 2 is a schematic representation of a hybrid FM IBOC waveform.

FIG. 2 is a schematic representation of a hybrid FM IBOC waveform 70. The waveform includes an analog modulated signal 72 located in the center of a broadcast channel 74, a first plurality of evenly spaced orthogonally frequency division multiplexed subcarriers 76 in an upper sideband 78, and a second plurality of evenly spaced orthogonally frequency division multiplexed subcarriers 80 in a lower sideband 82. The digitally modulated subcarriers are divided into partitions and various subcarriers are designated as reference subcarriers. A frequency partition is a group of 19 OFDM subcarriers containing 18 data subcarriers and one reference subcarrier.

The hybrid waveform 70 includes an analog FM-modulated signal, plus digitally modulated primary main subcarriers. The subcarriers are located at evenly spaced frequency locations. The subcarrier locations are numbered from −546 to +546. In the depicted waveform 70, the subcarriers are at locations +356 to +546 and −356 to −546. Each primary main sideband is comprised of ten frequency partitions. Subcarriers 546 and −546, also included in the primary main sidebands, are additional reference subcarriers. The amplitude of each subcarrier can be scaled by an amplitude scale factor.

Figure 3:
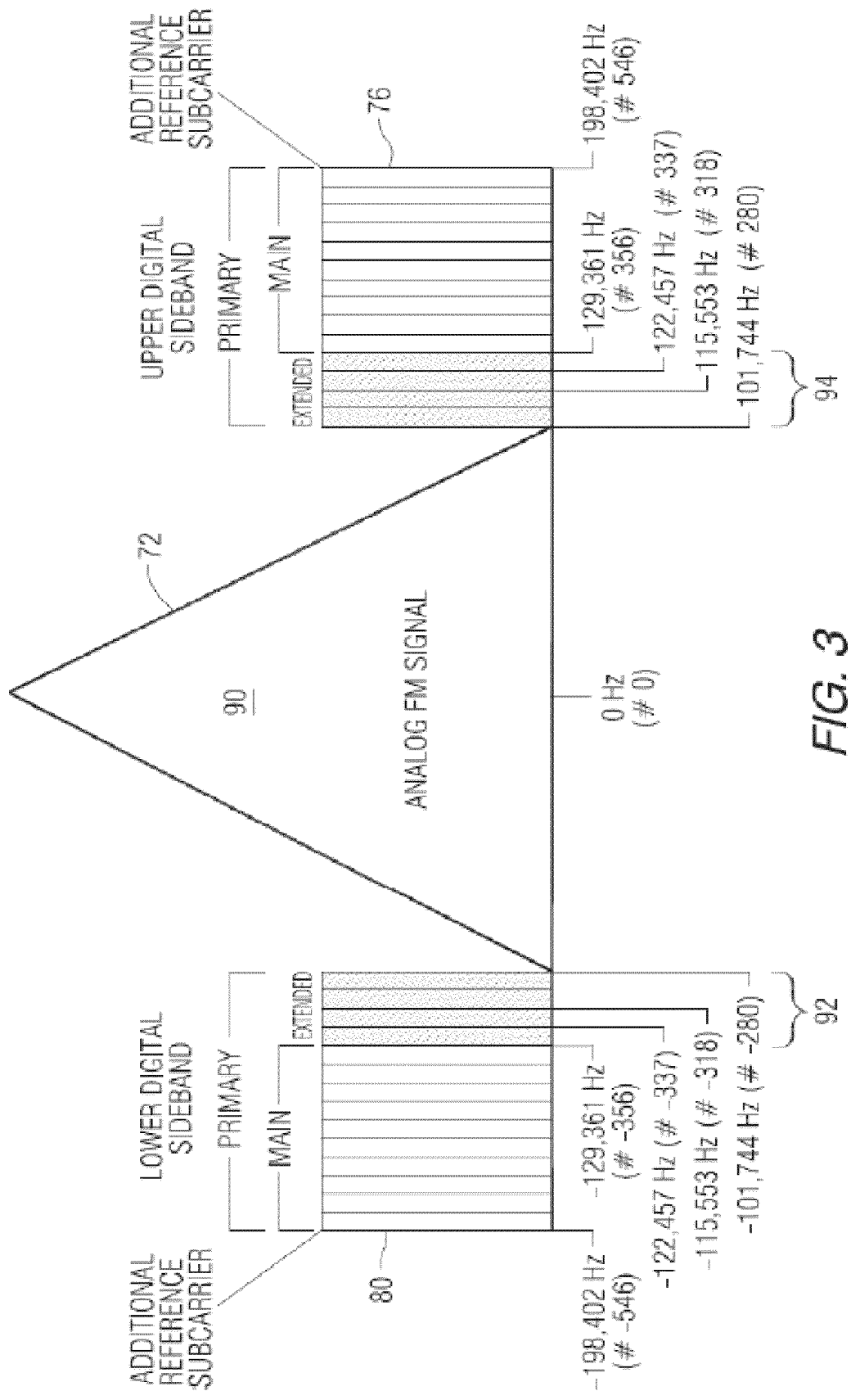
FIG. 3 is a schematic representation of an extended hybrid FM IBOC waveform.

FIG. 3 is a schematic representation of an extended hybrid FM IBOC waveform 90. The extended hybrid waveform 90 is created by adding primary extended sidebands 92, 94 to the primary main sidebands present in the hybrid waveform. One, two, or four frequency partitions can be added to the inner edge of each primary main sideband. The extended hybrid waveform 90 includes the analog FM signal plus digitally modulated primary main subcarriers (subcarriers +356 to +546 and −356 to −546) and some or all primary extended subcarriers (subcarriers +280 to +355 and −280 to −355).

The upper primary extended sidebands include subcarriers 377 through 355 (one frequency partition), 318 through 355 (two frequency partitions), or 280 through 355 (four frequency partitions). The lower primary extended sidebands include subcarriers −377 through −355 (one frequency partition), −318 through −355 (two frequency partitions), or −280 through −355 (four frequency partitions). The amplitude of each subcarrier can be scaled by an amplitude scale factor.

Figure 4:
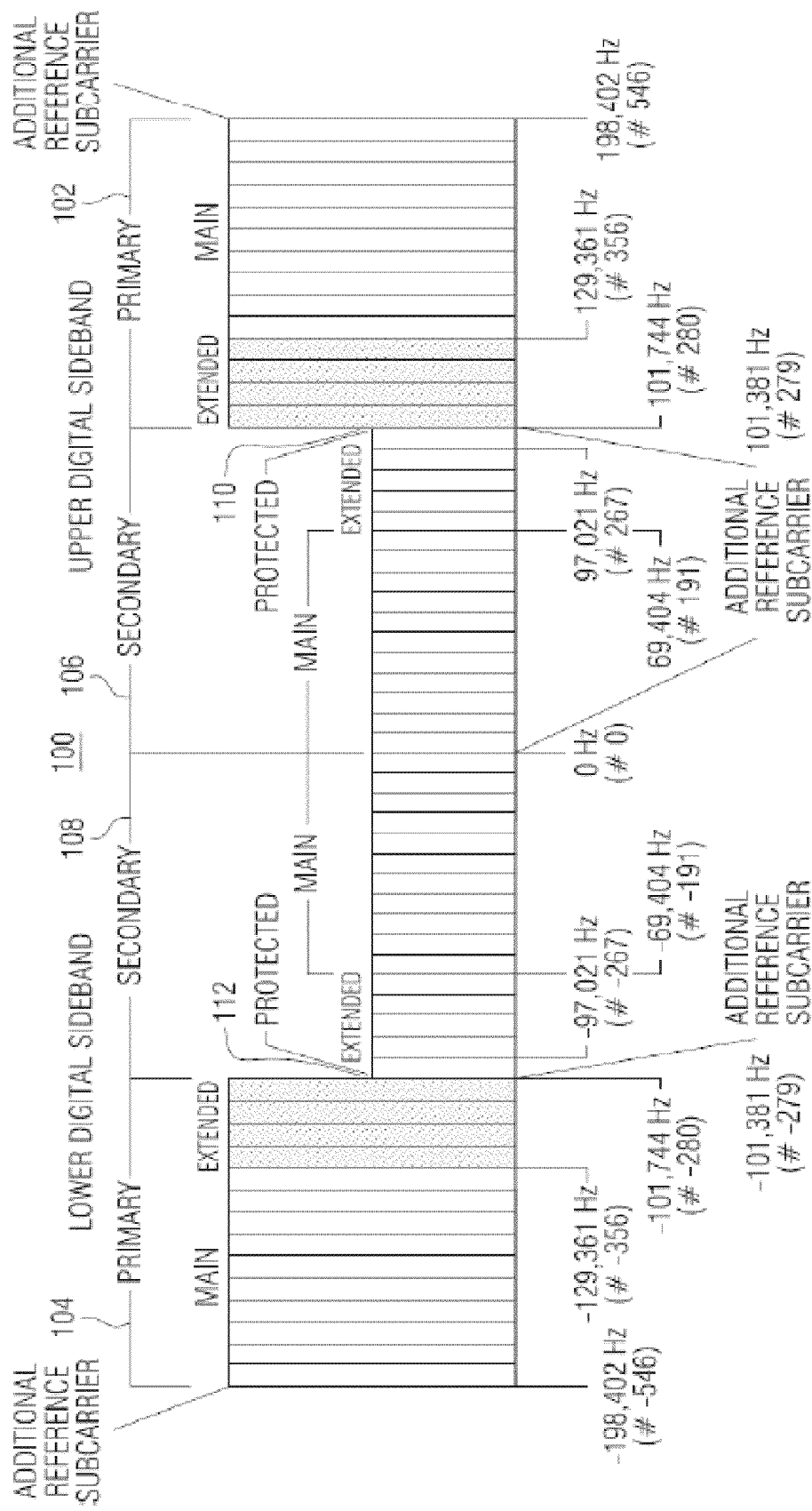
FIG. 4 is a schematic representation of an all-digital FM IBOC waveform.

FIG. 4 is a schematic representation of an all-digital FM IBOC waveform 100. The all-digital waveform 100 is constructed by disabling the analog signal, fully extending the bandwidth of the primary digital sidebands 102, 104, and adding lower-power secondary sidebands 106, 108 in the spectrum vacated by the analog signal. The all-digital waveform 100 in the illustrated embodiment includes digitally modulated subcarriers at subcarrier locations −546 to +546, without an analog FM signal.

In addition to the ten main frequency partitions, four extended frequency partitions are present in each primary sideband of the all-digital waveform. Each secondary sideband also has ten secondary main (SM) and four secondary extended (SX) frequency partitions. Unlike the primary sidebands, however, the secondary main frequency partitions are mapped nearer to the channel center with the extended frequency partitions farther from the center.

Each secondary sideband also supports a small secondary protected (SP) region 110, 112 including 12 OFDM subcarriers and reference subcarriers 279 and −279. The sidebands are referred to as "protected" because they are located in the area of spectrum least likely to be affected by analog or digital interference. An additional reference subcarrier is placed at the center of the channel (0). Frequency partition ordering of the SP region does not apply since the SP region does not contain frequency partitions.

Each secondary main sideband spans subcarriers 1 through 190 or −1 through −190. The upper secondary extended sideband includes subcarriers 191 through 256, and the upper secondary protected sideband includes subcarriers 267 through 278, plus additional reference subcarrier 279. The lower secondary extended sideband includes subcarriers −191 through −266, and the lower secondary protected sideband includes subcarriers −267 through −278, plus additional reference subcarrier −279. The total frequency span of the entire all-digital spectrum may be up to 396,803 Hz. The amplitude of each subcarrier can be scaled by an amplitude scale factor.

In each of the waveforms 70, 90, 100, the digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

In the hybrid waveform 70, the digital signal is transmitted in primary main (PM) sidebands on either side of the analog FM signal in the hybrid waveform. The power level of each sideband is appreciably below the total power in the analog FM signal. The analog signal may be monophonic or stereophonic, and may include subsidiary communications authorization (SCA) channels.

In the extended hybrid waveform 90, the bandwidth of the hybrid sidebands can be extended toward the analog FM signal to increase digital capacity. This additional spectrum, allocated to the inner edge of each primary main sideband, is termed the primary extended (PX) sideband.

In the all-digital waveform 100, the analog signal is removed and the bandwidth of the primary digital sidebands is fully extended as in the extended hybrid waveform. In addition, this waveform allows lower-power digital secondary sidebands to be transmitted in the spectrum vacated by the analog FM signal.

FIG. 5 is a schematic representation of an AM hybrid IBOC digital radio broadcasting waveform 120. The hybrid format includes the conventional AM analog signal 122 (bandlimited to about ±5 kHz) along with a nearly 30 kHz wide digital radio broadcasting signal 124. The spectrum is contained within a channel 126 having a bandwidth of about 30 kHz. The channel is divided into upper 130 and lower 132, frequency bands. The upper band extends from the center frequency of the channel to about +15 kHz from the center frequency. The lower band extends from the center frequency to about −15 kHz from the center frequency.

The AM hybrid IBOC digital radio broadcasting signal format in one example comprises the analog modulated carrier signal 134 plus OFDM subcarrier locations spanning the upper and lower bands. Coded digital information representative of the audio or data signals to be transmitted (program material), is transmitted on the subcarriers. The symbol rate is less than the subcarrier spacing due to a guard time between symbols.

As shown in FIG. 5, the upper band is divided into a primary section 136, a secondary section 138, and a tertiary section 144. The lower band is divided into a primary section 140, a secondary section 142, and a tertiary section 143. For the purpose of this explanation, the tertiary sections 143 and 144 can be considered to include a plurality of groups of subcarriers labeled 146 and 152 in FIG. 5. Subcarriers within the tertiary sections that are positioned near the center of the channel are referred to as inner subcarriers, and subcarriers within the tertiary sections that are positioned farther from the center of the channel are referred to as outer subcarriers. The groups of subcarriers 146 and 152 in the tertiary sections have substantially constant power levels. FIG. 5 also shows two reference subcarriers 154 and 156 for system control, whose levels are fixed at a value that is different from the other sidebands.

The power of subcarriers in the digital sidebands is significantly below the total power in the analog AM signal. The level of each OFDM subcarrier within a given primary or secondary section is fixed at a constant value. Primary or secondary sections may be scaled relative to each other. In addition, status and control information is transmitted on reference subcarriers located on either side of the main carrier. A separate logical channel, such as an IBOC Data Service (IDS) channel can be transmitted in individual subcarriers just above and below the frequency edges of the upper and lower secondary sidebands. The power level of each primary OFDM subcarrier is fixed relative to the unmodulated main analog carrier. However, the power level of the secondary subcarriers, logical channel subcarriers, and tertiary subcarriers is adjustable.

Using the modulation format of FIG. 5, the analog modulated carrier and the digitally modulated subcarriers are transmitted within the channel mask specified for standard AM broadcasting in the United States. The hybrid system uses the analog AM signal for tuning and backup.

FIG. 6 is a schematic representation of the subcarrier assignments for an all-digital AM IBOC digital radio broadcasting waveform. The all-digital AM IBOC digital radio broadcasting signal 160 includes first and second groups 162 and 164 of evenly spaced subcarriers, referred to as the primary subcarriers, that are positioned in upper and lower bands 166 and 168. Third and fourth groups 170 and 172 of subcarriers, referred to as secondary and tertiary subcarriers respectively, are also positioned in upper and lower bands 166 and 168. Two reference subcarriers 174 and 176 of the third group lie closest to the center of the channel. Subcarriers 178 and 180 can be used to transmit program information data.

Figure 7:
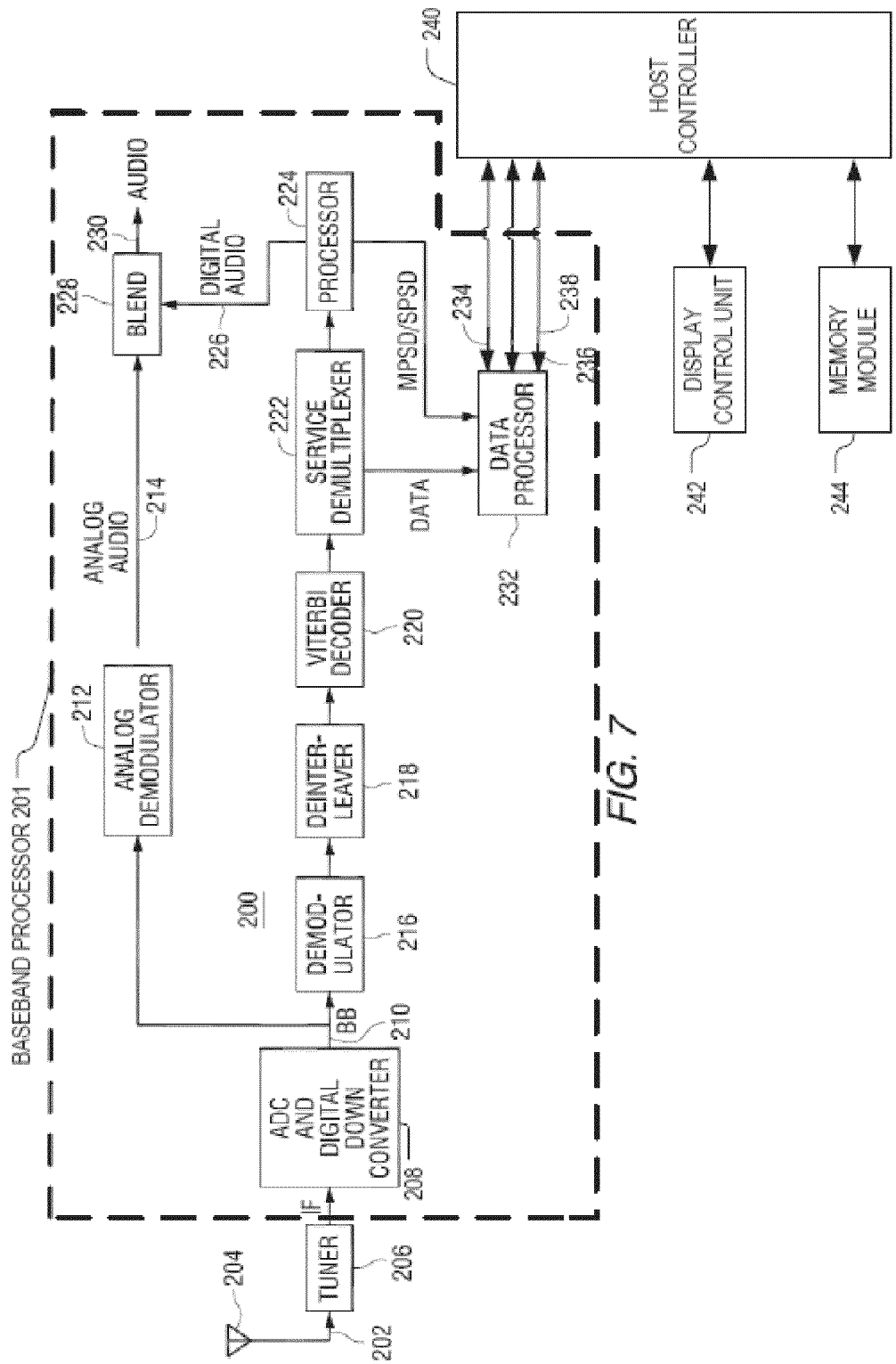
FIG. 7 is a functional block diagram of an AM IBOC digital radio broadcasting receiver in accordance with certain embodiments.

FIG. 7 is a simplified functional block diagram of selected components of an exemplary AM IBOC digital radio broadcasting receiver 200. While only certain components of the receiver 200 are shown for exemplary purposes, it should be apparent that the receiver may comprise a number of additional components and may be distributed among a number of separate enclosures having tuners and front-ends, speakers, remote controls, various input/output devices, etc. The receiver 200 has a tuner 206 that includes an input 202 connected to an antenna 204. The receiver also includes a baseband processor front end 201. The analog signal from the tuner 206 is provided to an analog-to-digital converter and digital down converter 208 to produce a baseband signal at output 210 comprising a series of complex signal samples. An analog demodulator 212 demodulates the analog modulated portion of the baseband signal to produce an analog audio signal on line 214. A digital demodulator 216 demodulates the digitally modulated portion of the baseband signal. Then the digital signal is deinterleaved by a deinterleaver 218, and decoded by a Viterbi decoder 220. A service demultiplexer 222 separates main and supplemental program signals from data signals. A processor 224 processes the program signals to produce a digital audio signal on line 226. The analog and main digital audio signals are blended as shown in block 228, or a supplemental digital audio signal is passed through, to produce an audio output on line 230. A data processor 232 processes the data signals and produces data output signals on lines 234, 236 and 238. The data lines 234, 236, and 238 may be multiplexed together onto a suitable bus such as an inter-integrated circuit (I2C), serial peripheral interface (SPI), universal asynchronous receiver/transmitter UART), or universal serial bus (USB). The data signals can include, for example, SIS, MPS data, SPS data, and one or more AAS.

The host controller 240 receives and processes the data signals (e.g., the SIS, NIPSD, SPSD, and AAS signals). The host controller 240 comprises a microcontroller that is coupled to the display control unit (DCU) 242 and memory module 244. Any suitable microcontroller could be used such as an Atmel® AVR 8-bit reduced instruction set computer (RISC) microcontroller, an advanced RISC machine (ARM®) 32-bit microcontroller or any other suitable microcontroller. Additionally, a portion or all of the functions of the host controller 240 could be performed in a baseband processor (e.g., the processor 224 and/or data processor 232). The DCU 242 comprises any suitable I/O processor that controls the display, which may be any suitable visual display such as an LCD or LED display. In certain embodiments, the DCU 242 may also control user input components via touch-screen display. In certain embodiments the host controller 240 may also control user input from a keyboard, dials, knobs or other suitable inputs. The memory module 244 may include any suitable data storage medium such as RAM, Flash ROM (e.g., an SD memory card), and/or a hard disk drive. In certain embodiments, the memory module 244 may be included in an external component that communicates with the host controller 240 such as a remote control.

Figure 8:
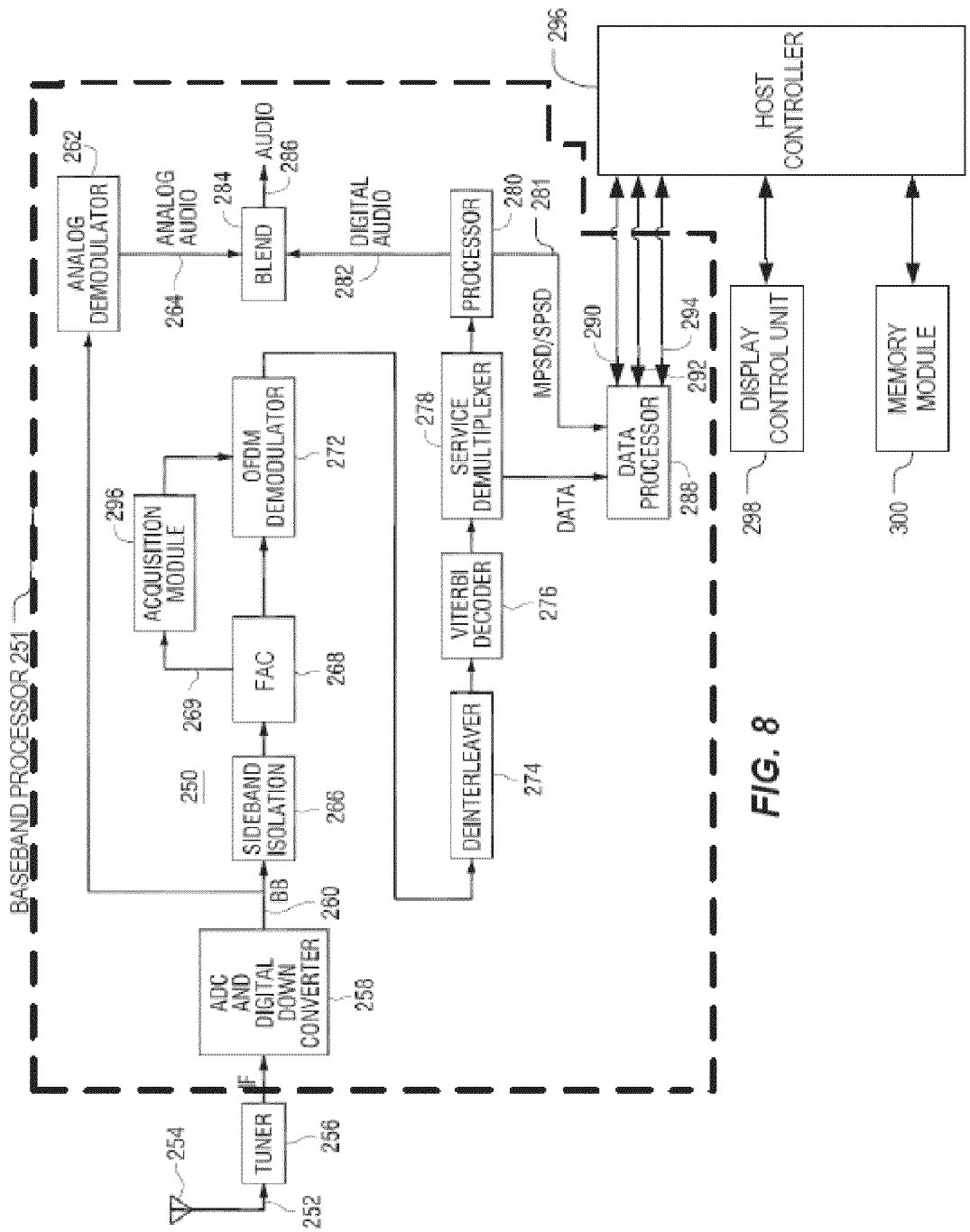
FIG. 8 is a functional block diagram of an FM IBOC digital radio broadcasting receiver in accordance with certain embodiments.

FIG. 8 is a simplified functional block diagram of selected components of an exemplary FM IBOC digital radio broadcasting receiver 250. While only certain components of the receiver 250 are shown for exemplary purposes, it should be apparent that the receiver may comprise a number of additional components and may be distributed among a number of separate enclosures having tuners and front-ends, speakers, remote controls, various input/output devices, etc. The exemplary receiver includes a tuner 256 that has an input 252 connected to an antenna 254. The receiver also includes a baseband processor front end 251. The analog signal from the tuner 256 is provided to an analog-to-digital converter and digital down converter 258 to produce a baseband signal at output 260 comprising a series of complex signal samples. The signal samples are complex in that each sample comprises a "real" component and an "imaginary" component. An analog demodulator 262 demodulates the analog modulated portion of the baseband signal to produce an analog audio signal on line 264. The digitally modulated portion of the sampled baseband signal is next filtered by isolation filter 266, which has a pass-band frequency response comprising the collective set of subcarriers f1-fn present in the received OFDM signal. First adjacent canceller (FAC) 268 suppresses the effects of a first-adjacent interferer. Complex signal 269 is routed to the input of acquisition module 296, which acquires or recovers OFDM symbol timing offset or error and carrier frequency offset or error from the received OFDM symbols as represented in received complex signal 269. Acquisition module 296 develops a symbol timing offset Δt and carrier frequency offset Δf, as well as status and control information. The signal is then demodulated (OFDM Demodulator block 272) to demodulate the digitally modulated portion of the baseband signal. Then the digital signal is deinterleaved by a deinterleaver 274, and decoded by a Viterbi decoder 276, A service demultiplexer 278 separates main and supplemental program signals from data signals. A processor 280 processes the main and supplemental program signals to produce a digital audio signal on line 282 and MPSD/SPSD 281. At blend block 284, the analog and main digital audio signals 264, 282 are blended, or the supplemental program signal is passed through, to produce an audio output on line 286. A data processor 288 processes the data signals and produces data output signals on lines 290, 292 and 294. The data lines 290, 292 and 294 may be multiplexed together onto a suitable bus such as an I2C, SPI, UART, or USB. The data signals can include, for example, SIS, MPS data, SPS data, and one or more AAS.

The host controller 296 receives and processes the data signals (e.g., SIS, MPS data, SPS data, and AAS). The host controller 296 comprises a microcontroller that is coupled to the DCU 298 and memory module 300. Any suitable microcontroller could be used such as an Atmel® AVR 8-bit RISC microcontroller, an advanced RISC machine (ARM®) 32-bit microcontroller or any other suitable microcontroller, Additionally, a portion or all of the functions of the host controller 296 could be performed in a baseband processor (e.g., the processor 280 and/or data processor 288). The DCU 298 comprises any suitable I/O processor that controls the display, which may be any suitable visual display such as an LCD or LED display. In certain embodiments, the DCU 298 may also control user input components via a touch-screen display. In certain embodiments the host controller 296 may also control user input from a keyboard, dials, knobs or other suitable inputs. The memory module 300 may include any suitable data storage medium such as RAM, Flash ROM (e.g., an SD memory card), and/or a hard disk drive. In certain embodiments, the memory module 300 may be included in an external component that communicates with the host controller 296 such as a remote control.

In practice, many of the signal processing functions shown in the receivers of FIGS. 7 and 8 can be implemented using one or more integrated circuits. For example, while the signal processing block, host controller, DCU, and memory module are shown in FIGS. 7-8 as separate components, the functions of two or more of these components could be combined in a single processor (e.g., a System on a Chip (SoC))

Figure 9A:
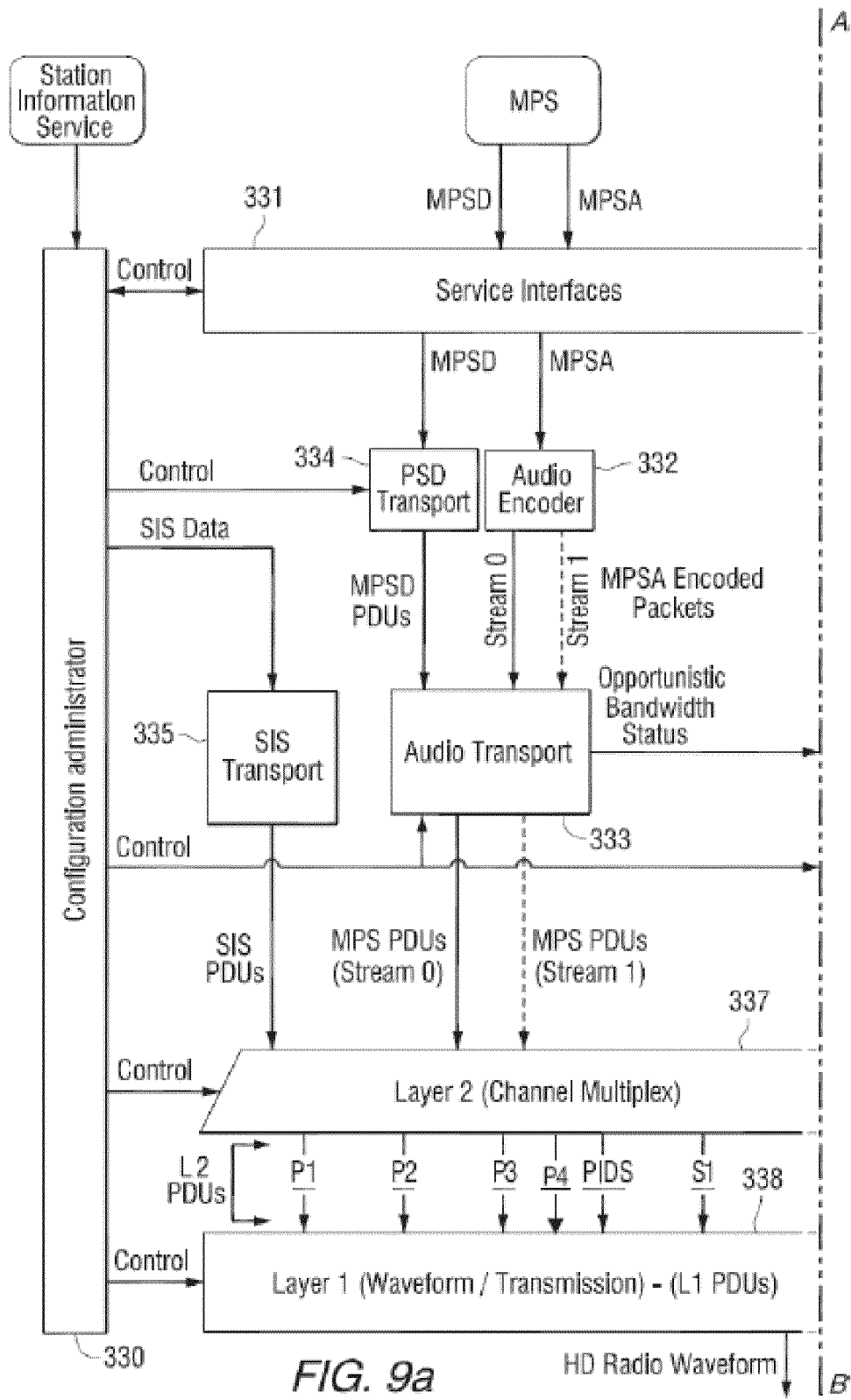
FIGS. 9a and 9b are diagrams of an IBOC digital radio broadcasting logical protocol stack from the broadcast perspective.
Figure 9B:
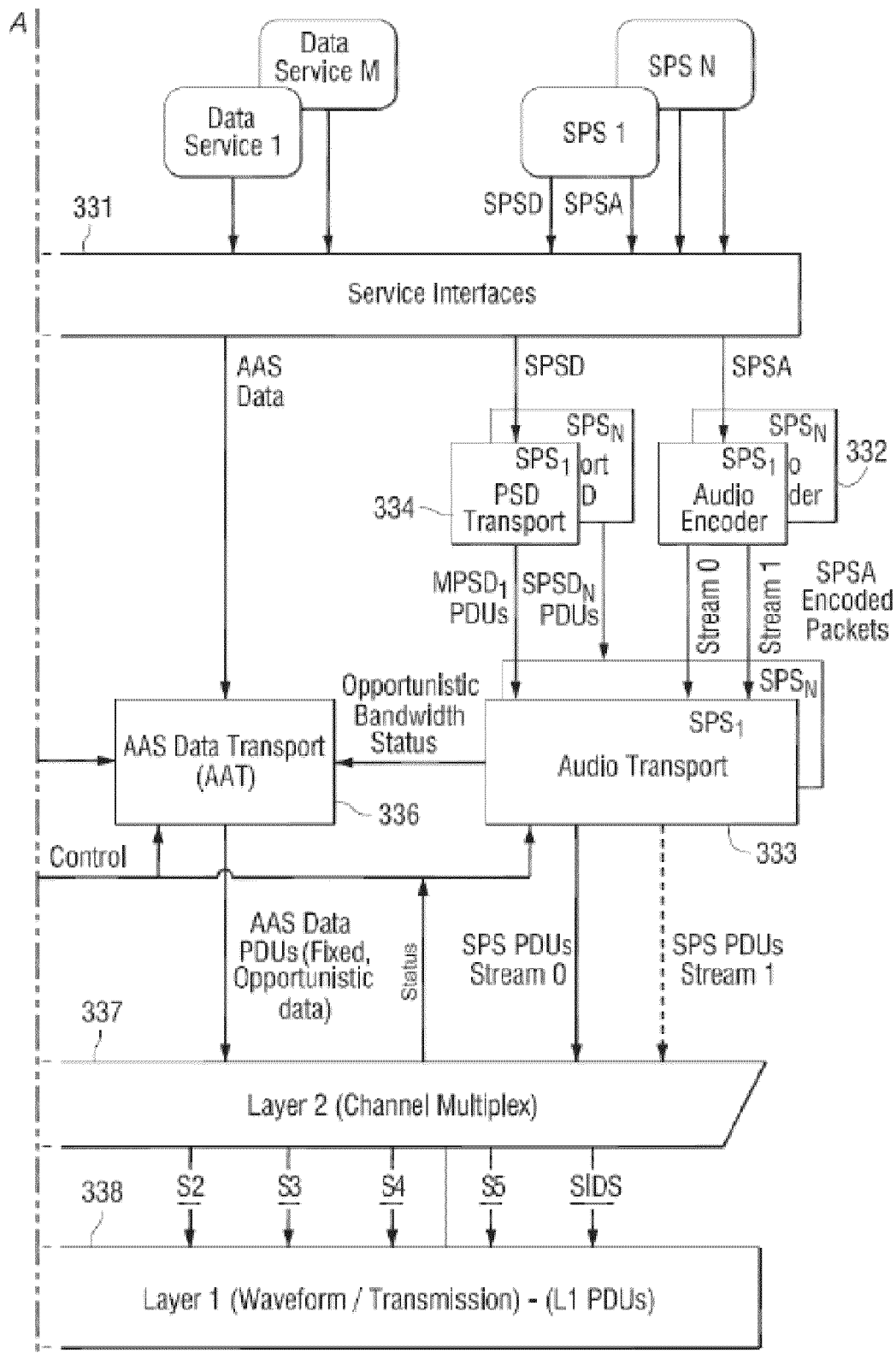

FIGS. 9a-b show diagrams of an IBOC digital radio broadcasting logical protocol stack from the transmitter perspective. From the receiver perspective, the logical stack will be traversed in the opposite direction. Most of the data being passed between the various entities within the protocol stack are in the form of protocol data units (PDUs). A PDU is a structured data block that is produced by a specific layer or process within a layer) of the protocol stack. The PDUs of a given layer may encapsulate PDUs from the next higher layer of the stack and/or include content data and protocol control information originating in the layer (or process) itself. The PDUs generated by each layer (or process) in the transmitter protocol stack are inputs to a corresponding layer (or process) in the receiver protocol stack.

As shown in FIGS. 9a-b, there is a configuration administrator 330, which is a system function that supplies configuration and control information to the various entities within the protocol stack. The configuration/control information can include user defined settings, as well as information generated from within the system such as GPS time and position. The service interfaces 331 represent the interfaces for all services. The service interface may be different for each of the various types of services. For example, for MPS audio and SPS audio, the service interface may be an audio card. For MPS data and SPS data the interfaces may be in the form of different APIs. For all other data services the interface is in the form of a single API. An audio encoder 332 encodes both MPS audio and SPS audio to produce core (Stream 0) and optional enhancement (Stream 1) streams of MPS and SPS audio encoded packets, which are passed to audio transport 333. Audio encoder 332 also relays unused capacity status to other parts of the system, thus allowing the inclusion of opportunistic data. MPS and SPS data is processed by PSD transport 334 to produce MPS and SPS data PDUs, which are passed to audio transport 333. Audio transport 333 receives encoded audio packets and PSD PDUs and outputs bit streams containing both compressed audio and program service data. The SIS transport 335 receives SIS data from the configuration administrator and generates SIS PDUs. A SIS PDU can contain station identification and location information, indications regarding provided audio and data services, as well as absolute time and position correlated to GPS, as well as other information conveyed by the station. The AAS data transport 336 receives AAS data from the service interface, as well as opportunistic bandwidth data from the audio transport, and generates AAS data PDUs, which can be based on quality of service parameters. The transport and encoding functions are collectively referred to as Layer 4 of the protocol stack and the corresponding transport PDUs are referred to as Layer 4 PDUs or L4 PDUs. Layer 2 (337), which is the channel multiplex layer, receives transport PDUs from the SIS transport, AAS data transport, and audio transport, and formats them into Layer 2 PDUs. A Layer 2 PDU includes protocol control information and a payload, which can be audio, data, or a combination of audio and data. Layer 2 PDUs are routed through the correct logical channels to Layer 1 (338), wherein a logical channel is a signal path that conducts L1 PDUs through Layer 1 with a specified grade of service, and possibly mapped into a predefined collection of subcarriers. There are multiple Layer 1 logical channels based on service mode, wherein a service mode is a specific configuration of operating parameters specifying throughput, performance level, and selected logical channels. The number of active Layer 1 logical channels and the characteristics defining them vary for each service mode. Status information is also passed between Layer 2 and Layer 1. Layer 1 converts the PDUs from Layer 2 and system control information into an AM or FM IBOC digital radio broadcasting waveform for transmission. Layer 1 processing can include scrambling, channel encoding, interleaving, OFDM subcarrier mapping, and OFDM signal generation. The output of OFDM signal generation is a complex, baseband, time domain pulse representing the digital portion of an IBOC signal for a particular symbol. Discrete symbols are concatenated to form a continuous time domain waveform, which is modulated to create an IBOC waveform for transmission.

Figure 10:
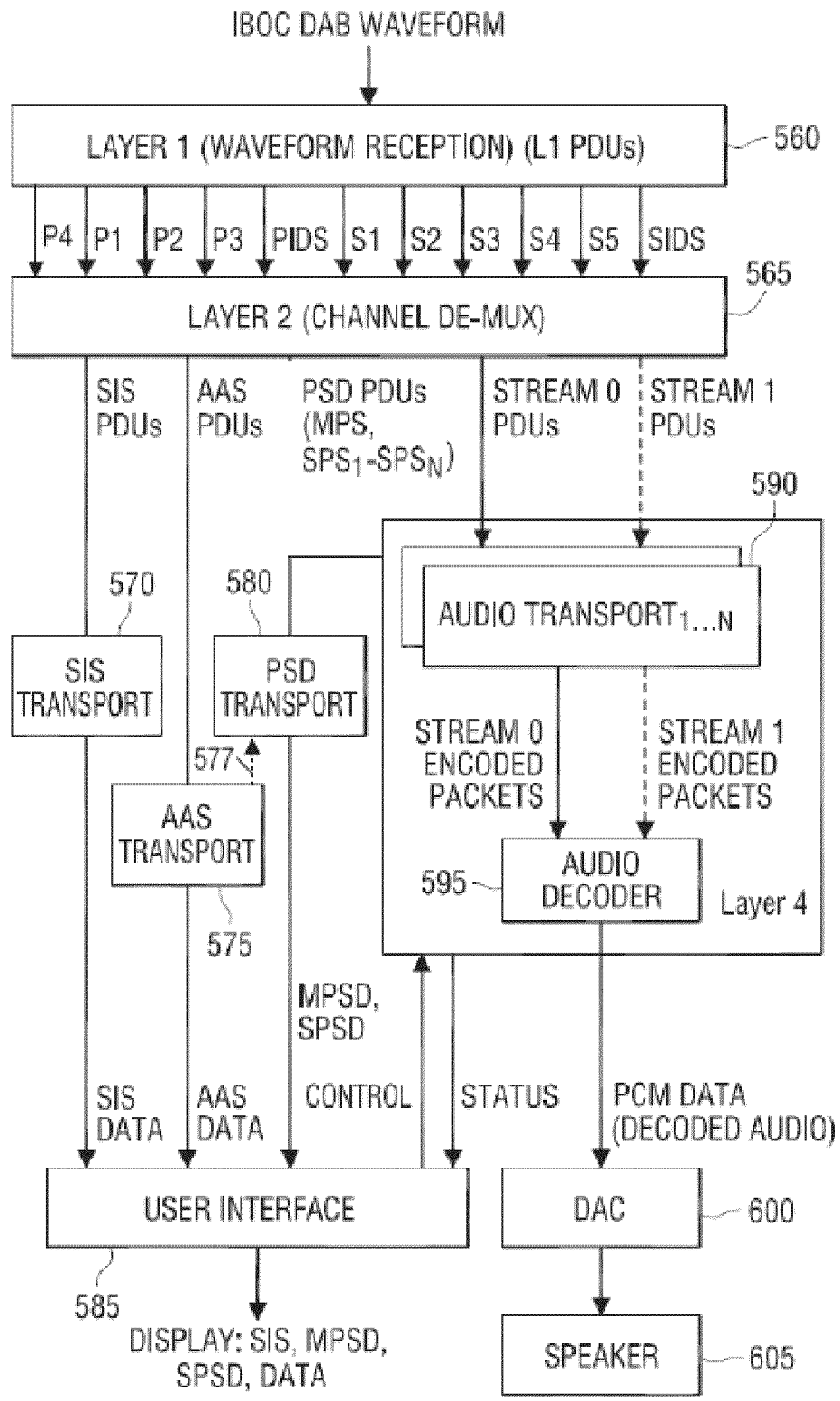
FIG. 10 is a diagram of an IBOC digital radio broadcasting logical protocol stack from the receiver perspective.

FIG. 10 shows the logical protocol stack from the receiver perspective. An IBOC waveform is received by the physical layer, Layer 1 (560), which demodulates the signal and processes it to separate the signal into logical channels. The number and kind of logical channels will depend on the service mode, and may include logical channels P1-P4, Primary IBOC Data. Service Logical Channel (PIDS), S1-S5, and SIDS. In addition, logical channels for data services may be divided into sub-channels by, for example, time-division multiplexing. These sub-channels can provide additional divisibility of the logical channels to facilitate a wider variety of data services.

Layer 1 produces L1 PDUs corresponding to the logical channels and sends the PDUs to Layer 2 (565), which demultiplexes the L1 PDUs to produce SIS PDUs, AAS PDUs, and Stream 0 (core) audio PDUs and Stream 1 (optional enhanced) audio PDUs. The SIS PDUs are then processed by the SIS transport 570 to produce SIS data, the AAS PDUs are processed by the AAS transport 575 to produce AAS data, and the PSD PDUs are processed by the PSD transport 580 to produce MPS data (MPSD) and any SPS data (SPSD), Encapsulated PSD data may also be included in AAS PDUs, thus processed by the AAS transport processor 575 and delivered on line 577 to PSD transport processor 580 for further processing and producing MPSD or SPSD. The SIS data, AAS data, MPSD and SPSD are then sent to a user interface 585. The SIS data, if requested by a user, can then be displayed. Likewise, MPSD, SPSD, and any text based or graphical AAS data can be displayed, The Stream 0 and Stream 1 PDUs are processed by Layer 4, comprised of audio transport 590 and audio decoder 595, There may be up to N audio transports corresponding to the number of programs received on the IBOC waveform. Each audio transport produces encoded MPS packets or SPS packets, corresponding to each of the received programs. Layer 4 receives control information from the user interface, including commands such as to store or play programs, and information related to seek or scan for radio stations broadcasting an all-digital or hybrid IBOC signal. Layer 4 also provides status information to the user interface.

To illustrate selected example embodiments for recovering audio transport elements from a received digital radio broadcast signal frame, reference is now made to FIG. 11 which depicts an example protocol data unit (PDU) frame format structure 700 for broadcasting audio packets in an IBOC digital radio signal. The depicted PDU format structure 700 includes a header portion 701, a program service data (PSD) field 702, and one or more encoded audio packets 703-708. The header portion 701 includes a fixed header portion (with RS parity bytes 710 and the PDU Control Word 711) and a variable header portion 712-715 (which includes a variable number of audio packet location fields (Loc 0, Loc 1, . . . , Loc NOP-1) 712-714 and an optional Header Expansion field 715) positioned between the fixed header portion 711 and the PSD field 702. The PDU Control Word 711 is protected by a 96-byte Reed-Solomon (RS) codeword 718 having a fixed size so that it may span portions of the Header Expansion field 715, PSD field 702, and possibly the encoded audio packets 703-708. Thus, the PDU format structure 700 includes the audio packet location fields (locators) 712-714, optional Header Expansion field 715, and a variable number of encoded audio packets 703-708. Each locator (e.g., Loc0 712) points to the CRC byte (e.g., CRC-8 704) that follows the packet (e.g., Packet 0 703) that it covers, using one locator per packet. The size of the locator fields (Lc bits) is a variable and is optimized (matched) to the PDU length to reduce overhead. The location, as indicated in bytes by each locator, is in reference to the beginning of the PDU (i.e. the first PDU byte is the first byte of the RS Parity 710). Each encoded audio packet (e.g., 705) is protected by an 8-bit CRC field (e.g., 706).

The fields enclosed by the dotted lines (e.g., Header Expansion 715, PSD 716, portion of encoded audio packets 717) are part of the RS codeword 718 only conditionally. The overall length of the RS parity 710, PDU control word 711, and audio packet locators 712-714 may be less than the 96-byte RS codeword 718. When this case occurs, additional fields (Header Expansion 715, PSD 716, and Packet 0 717) fall within the 96-byte RS codeword 718 and will be included in the RS parity byte computation.

Within the PDU Control Word 711, a plurality of header bytes 720-725 are defined with an allocation of control bits to control the audio decoding of the encoded audio packets 703-708. In particular and as shown in FIG. 12, the PDU control word 711 may include a first header byte 720 (Byte 0) that includes PDU sequence number bits (bit positions 46-47), stream ID bits (bit positions 44-45), and audio codec mode bits (bit positions 40-43). A second header byte 721 (Byte 1) may include per-stream delay bits (bit positions 35-39), blend control bits (bit positions 33-31), and PDU sequence number bit (bit position 32). A third header byte 722 (Byte 2) may include audio codec latency bits (bit positions 30-31) and post-decoded common delay bits (bit positions 24-29). A fourth header byte 723 (Byte 3) may include starting sequence number bits for the first non-partial packet in the PDU (bit positions 19-23), a first partial packet bit ($P_{first}$) which is set if the first encoded audio packet of the PDU is a continuation from the last PDU (bit position 18), a last partial packet bit ($P_{last}$) which is set if the last encoded audio packet of the PDU will continue into the next PDU (bit position 17), and an audio codec latency bit (bit position 16). A fifth header byte 724 (Byte 4) may include a header expansion flag (HEF) bit (bit position 15), the Number of Packets (NoP) bits specifying the number of encoded audio packets (full and partial) contained within the PDU (bit positions 9-14), and a starting sequence number bit (bit position 8). A sixth header byte 725 (Byte 5) may include a location (La) bits specifying the location of the last byte of the program service data field relative to the first byte (Byte 0) of the PDU control word (bit positions 0-7). As seen from the foregoing, the PDU header 701 includes control word information specifying the number of packets (NoP) (e.g., bits 9-14 of header byte 4 724), as well as supplementary information within the same header regarding the presence of partial packets (e.g., flags $P_{first}$ and $P_{last}$ at bit positions 17-18 in header byte 3 723) and the starting sequence number of the first non-partial packet (e.g., bit positions 19-23 in header byte 3 723).

Using the self-contained encapsulated PDU structures 700, 709 shown in FIGS. 11-12, IBOC digital radio broadcasting technology can transport a plurality of encoded audio packets 703-708 for each program to provide digital quality audio that is superior to existing analog broadcasting formats. In addition, IBOC digital radio broadcasting technology can use the encapsulated PDU structures 700, 709 to provide audio multicasting, which is the ability to deliver several audio programs or audio services over one channel in the AM or FM spectrum. For example, multiple audio services can include alternative music formats, local traffic, weather, news, and sports. The supplemental services and programs can be accessed in the same manner as the traditional station frequency using tuning or seeking functions. For example, if the analog modulated signal is centered at 94.1 MHz, the same broadcast in IBOC can include supplemental services 94.1-2, and 94.1-3. Highly specialized supplemental programming can be delivered to tightly targeted audiences, creating more opportunities for advertisers to integrate their brand with program content. As used herein, audio multicasting includes the transmission of one or more programs in a single digital radio broadcasting channel or on a single digital radio broadcasting signal. Audio multicast content can include a main program service (MPS), one or more supplemental program services (SPS) and program service data (PSD).

The National Radio Systems Committee, a standard-setting organization sponsored by the National Association of Broadcasters and the Consumer Electronics Association, adopted an IBOC standard, designated NRSC-5, in September 2005. NRSC-5 and its updates, the disclosure of which are incorporated herein by reference, set forth the requirements for broadcasting digital audio and ancillary data over AM and FM broadcast channels. The standard and its reference documents contain detailed explanations of the RF/transmission subsystem and the audio transport and service multiplex subsystems, Copies of the standard can be obtained from the NRSC at http://www.nrscstandards.org/SG.asp. iBiquity's HD Radio technology is an implementation of the NRSC-5 IBOC standard. Further information regarding HD Radio technology can be found at www.hdradio.com and www.ibiquity.com, Other types of digital radio broadcasting systems include satellite systems such as Satellite Digital Audio Radio Service (SDARS, e.g., XM Radio, Sirius), Digital Audio Radio Service (DARS, e.g., WorldSpace), and terrestrial systems such as Digital Radio Mondiale (DRM), Eureka 147 (branded as DAB Digital Audio Broadcasting), DAB Version 2, and FMeXtra. As used herein, the phrase "digital radio broadcasting" encompasses digital audio broadcasting including in-band on-channel broadcasting, as well as other digital terrestrial broadcasting and satellite broadcasting.

When multicasting is used to present multiple audio programs within the same logical channel, the PDUs from each individual program may be concatenated and multiplexed into a single transport L2/L4 transfer frame. The transfer frame is them processed by the physical layer L1 as a contiguous bit stream, within the frame boundaries. At the receiver, the detection process of the physical frame also handles the physical layer frame in a contiguous way. However, adverse channel conditions can result in transmission errors that can occur anywhere in the transfer frame, and may be concentrated in bursts or spread across the entire frame. As a result, the included audio programs' PDUs may incur errors in any portion of the PDU, including errors in the PDU header or within individual packets.

As seen from the definition of the PDU structure 700 in which the header 701 includes audio packet location fields (Loc 0, Loc 1, . . . , Loc NOP−1) 712-714 and La 725 (which is the end of PSD 716) which is then followed by the start of the first audio packet 717, proper decoding of the header 701 is important for identifying the boundaries between audio packets 703-308. In addition, header decoding is important for identifying PDU boundaries between one program's PDU and the next program's PDU. As a result, any header decode failure in a header (e.g., 701) of a first PDU (e.g., 700) not only impairs the ability to detect audio packets (e.g., 703-708) within that PDU, but can also impair the detection of any content from the consecutive PDUs within the same transfer frame. Such extended multiple PDU decode failures can result in prolonged blend to either analog signal or to silence, even when numerous audio packets (or even an entire consecutive PDU) are not exhibiting any errors.

Referring now to FIGS. 13-16, there is described selected embodiments of a method for recovering and/or salvaging hybrid digital codec (HDC) audio PDU transport elements at a digital radio broadcast receiver. In selected embodiments, the disclosed methodology makes use of selected PDU header elements and associated PDU parameter values to enable recovery of the audio packets within a PDU along with the next consecutive PDU boundary. The method may also be implemented to provide a scalable search process that may be throttled dynamically or configured statically for available computation resources within a specific implementation and/or at a specific time. The more computation resources are allocated for this process at a time, the broader and deeper recovery process may take place.

Figure 13:
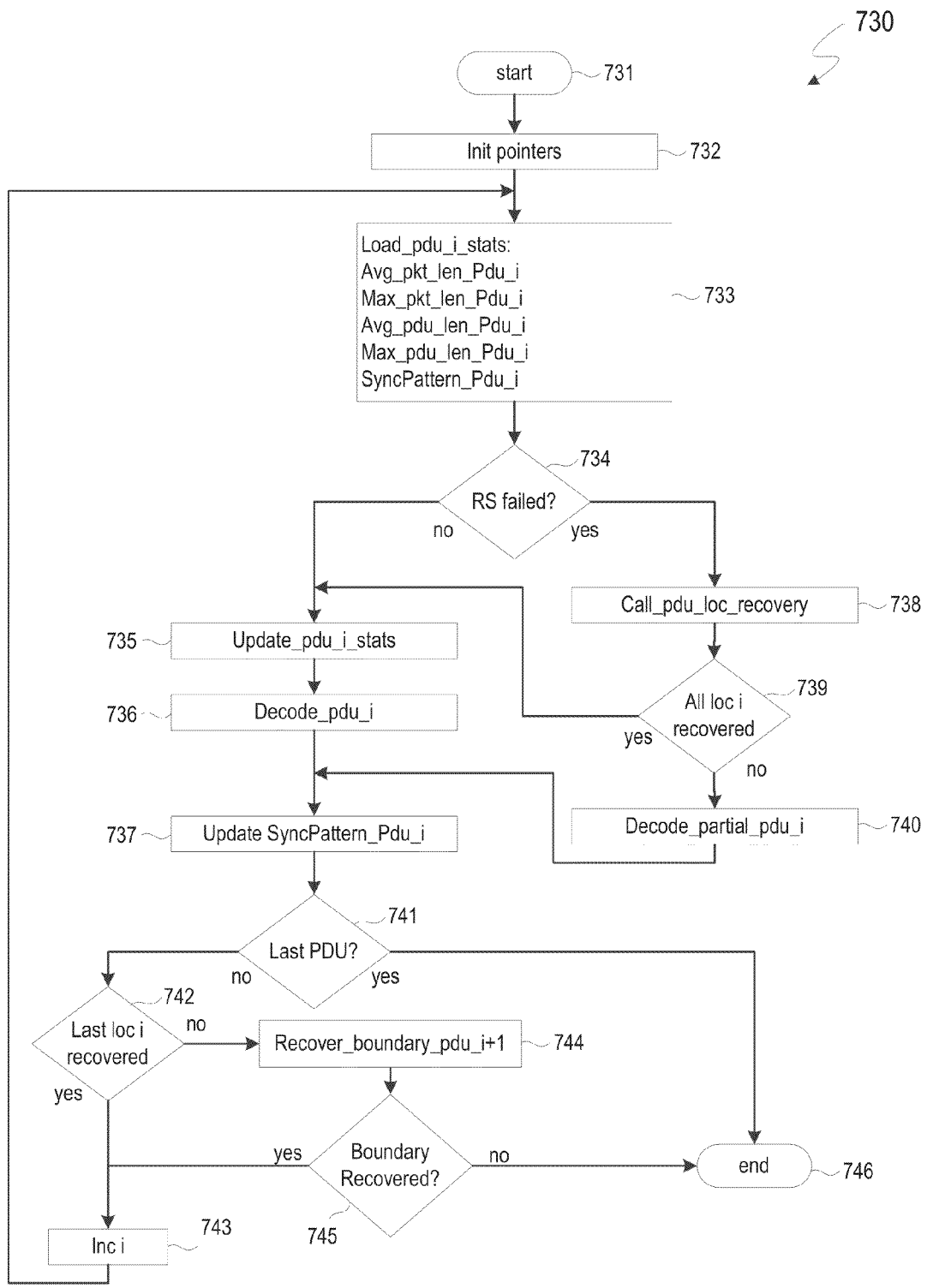
FIG. 13 illustrates an exemplary PDU decoding process in which audio PDU transport element recovery may be performed at a digital radio broadcast receiver in accordance with selected embodiments.

A regular PDU decoding process is well established and is not described herein, though details for the HD Radio air interface audio transport and advanced application services (AAS) transport are published at the NRSC site (www.nrsc-standards.org/SG/NRSC-5-C.asp), including the audio transport document (1017s, rev. G) (see chapter 5) and the AAS document (1019s, rev. G) (see FIGS. 4-2 and 4-3). For purposes of the present disclosure, an example PDU decoding process is illustrated in FIG. 13 which shows a decoding process 730 performed at a digital radio broadcast receiver to perform audio PDU transport element recovery in accordance with selected embodiments.

Once the decoding process 730 begins (step 731) and the pointers are initialized (step 732) to decode a selected PDU (PDU i), selected information parameters or statistics for the selected PDU i are loaded or retrieved from memory or otherwise computed at step 733. The retrieved/computed statistics may include an Average Packet Length parameter (Avg_pkt_len_PDUi) that is calculated over all the successfully decoded (complete) packets, from the beginning of the decoding process. In selected embodiments, the Average Packet Length parameter may retrieved from the Avg_pkt_len_PDUi buffer or memory location which stores a rounded up value from the following exemplary calculation:

$$\text{Avg\_pkt\_len}(n) = 63/64 * \text{Avg\_pkt\_len}(n-1) + 1/64 * \text{pkt\_len}(n).$$

The retrieved statistics at step 733 may also include a Maximum Packet Length parameter (Max_pkt_len_PDUi) that is calculated over all the successfully decoded (complete) packets, from the beginning of the decoding process. In selected embodiments, the Maximum Packet Length parameter may be calculated by comparing the current packet length against a reference packet length value to store whichever is larger in a Max_pkt_len_PDUi buffer or memory location.

The retrieved statistics at step 733 may also include an Average PDU Length parameter (Avg_pdu_len_PDUi) that is calculated over all the successfully decoded (complete) PDUs, from the beginning of the decoding process. In selected embodiments, the Average PDU Length parameter may be retrieved from the Avg_pdu_len_PDUi buffer or memory location which stores a rounded up value from the following exemplary calculation:

$$\text{Avg\_PDU\_len}(n) = 31/32 * \text{Avg\_PDU\_len}(n-1) + 1/32 * \text{len}(n).$$

The retrieved statistics at step 733 may also include a Maximum PDU Length parameter (Max_pdu_len_PDUi) that is calculated over all the successfully decoded (complete) PDUs, from the beginning of the decoding process. In selected embodiments, the Maximum PDU Length parameter may be calculated by comparing the current PDU length against a reference PDU length value to store whichever is larger in a Max_pdu_len_PDUi buffer or memory location.

The retrieved statistics at step 733 may also include a predetermined PDU synchronization pattern (SyncPattern_PDUi) parameter that is calculated or extracted from the PDU's header elements. By defining the PDU sync pattern parameter to include selected header elements that are quasi-static or otherwise change only when a program is added, the PDU sync pattern can be used to characterize the PDUs for each program within the same logical channel. The PDU sync pattern parameter may also be defined to include other cyclic and predictable header elements, such as sequence number. In this way, once the header elements are validated with a successful consistency check, the PDU sync pattern parameter may be established and updated routinely for the next expected PDU for the same program and the same logical channel. In selected example embodiments, the PDU sync pattern parameter may be constructed with predetermined bits from the PDU control word 711 in the header 701 to include 25 bits from header byte 0 (720), header byte 1 (721), header byte 2 (722), and the least significant bit from header byte 3 (723). These bits are also indexed 24 thru 47, and bit 16. With this construction of the PDU sync pattern parameter, control word bits 16, 24 thru 31 and 33 thru 45 are quasi-static, and once they pass consistency check, they may be considered constant for the purpose of being used in the PDU sync pattern parameter. Finally, control word bits 32, 46 and 47, which indicate the sequence number, will change continuously and cyclically, and thus should be calculated for each PDU, for its expected value in the succeeding PDU.

At step 734, the header 701 is checked for errors and possible error correction as part of the decoding process. In selected embodiments, where the PDU control word 711 is protected by a 96-byte Reed-Solomon (RS) codeword 718, header decode Check step 734 determines if the header decoding process was successful by performing RS error correction processing. In selected embodiments, the success or failure of the PDU header decode depends on the number of errors that can be tolerated by the RS codeword check. If the number of errors that can be tolerated is 4, up to four errors can be fixed in the 96-byte RS codeword. If there are more errors, then the entire PDU is rejected, possibly resulting in a blend to analog, depending on the number of packets in the PDU.

When the header decoding process is successful and there is no RS failure (negative outcome to step 734), then the selected information parameters or statistics for the selected PDU i are updated at step 735, resulting in updated maximum and average packet length parameters, as well as updated maximum and average PDU length parameters as described above. At step 736, the entire PDU i associated with the successfully decoded header is decoded to extract the encoded audio packets from PDU i. At step 737, the PDU sync pattern parameter for the next PDU of the same program should be calculated, regardless of the success in decoding the PDU header and packets, as it only depends on updating the sequence number.

Referring back to step 734, if the header decoding process was not successful and there was an RS failure (affirmative outcome to step 734), then a locators recovery process is called at step 738. As described herein, the locators recovery process (step 738) may be used to recover one or more audio packet location fields (locators) 712-714 from the PDU header 701. If the locators recovery process succeeds in recovering all audio packet location fields from the PDU header 701 (affirmative outcome to step 739), then the entirety of the selected PDU i may be decoded (at step 736) after updating the relevant selected information parameters or statistics (at step 735). However, if the locators recovery process recovers only some of the audio packet location fields from the PDU header 701 (negative outcome to step 739), then only part of the selected PDU i may be decoded (at step 740) before updating the PDU sync pattern parameter (at step 737).

At step 741, the decoding process determines if the currently processed PDU is the last PDU in the current L4 transfer flame. If indeed that was already the last PDU in the transfer frame (affirmative outcome to step 741), then the decode process ends at step 746. However, if the currently processed PDU i 700 is not the last PDU in the transfer frame (negative outcome to step 741), then the decoding of the next PDU i+1 709 begins by first determining if the last audio packet location field or locator for the current PDU i has been recovered. For example, if the last audio packet location field was recovered for the current PDU i (affirmative outcome to step 742), then the recovered last audio packet location field can be used to locate the boundary between the current PDU i 700 and the next PDU i+1 709, thereby allowing the decoding process to start for the next consecutive PDU for a different program within the same transfer frame. At this point, the PDU count value "i" may be incremented (at step 743), and the decode process returns to load or retrieve selected information parameters or statistics for the incremented PDU i+1 at step 733. However, if the last audio packet location field was not recovered for the current PDU i (negative outcome to step 742), then a call to the PDU boundary recovery process is made (step 744). If the boundary recovery process succeeds (affirmative outcome of step 745) then the process continues to the PDU count value "i" to be incremented (at step 743), and the decode process returns to load or retrieve selected information parameters or statistics for the incremented PDU i+1 at step 733. However, if the boundary recovery process fails (negative outcome of step 745), then the process of decoding PDUs in the current transfer frame ends (step 746).

Referring back to the header recovery step 738, the disclosed digital radio broadcast receiver may call a packet locator recovery process for recovering and/or salvaging hybrid digital coding (HDC) audio PDU transport elements in cases where header decoding fails in the current PDU. The packet locator recovery process uses selected PDU header elements to recover the audio packets and the next consecutive PDU boundary from the expected placement in the current PDU's header. In operation and as described more fully below, the header from the current PDU i is processed to sequentially extract the La field (i.e. the end of PSD 716 and the start location of the first packet in the PDU 717) and audio packet location fields (Loc 0, Loc 1, . . . Loc NoP-1) from the header, and then perform validity tests on the corresponding audio packet for each packet location field. As described herein, the validity tests are applied based on the projected location of the audio packet in the PDU (e.g., first, middle, or last). Depending on the results of the packet error detection processing (i.e., CRC calculation) as performed on a selected audio packet length, the packet validity is decided. For example, if an audio packet passes CRC calculation as performed on the audio packet length, using the packet's extracted locator (from the header) and the previous packet's locator (whether extracted or recovered), then the current packet's locator (as well as the previous packet's locator) is considered "valid". However, if the audio packet fails that validity test, then a plurality of CRC calculations are performed using a range of estimated packet locations that are defined by a range of one or more of the information parameters or statistics for the selected PDU i. The resulting CRC calculation(s) for each audio packet are evaluated (e.g., whether the checksum matches for any of the calculations) to determine if any of the searched corresponding audio packet location field is valid (in which case it is stored in a "valid" list) or invalid (in which case it is stored in an "invalid" list). In addition, the packet locator recovery process may be implemented as a scalable search process that is throttled dynamically or configured statically for available computation resources within a specific implementation and/or at a specific time, The more computation resources are allocated for this process at a time, the broader and deeper recovery process may take place.

Figure 14:
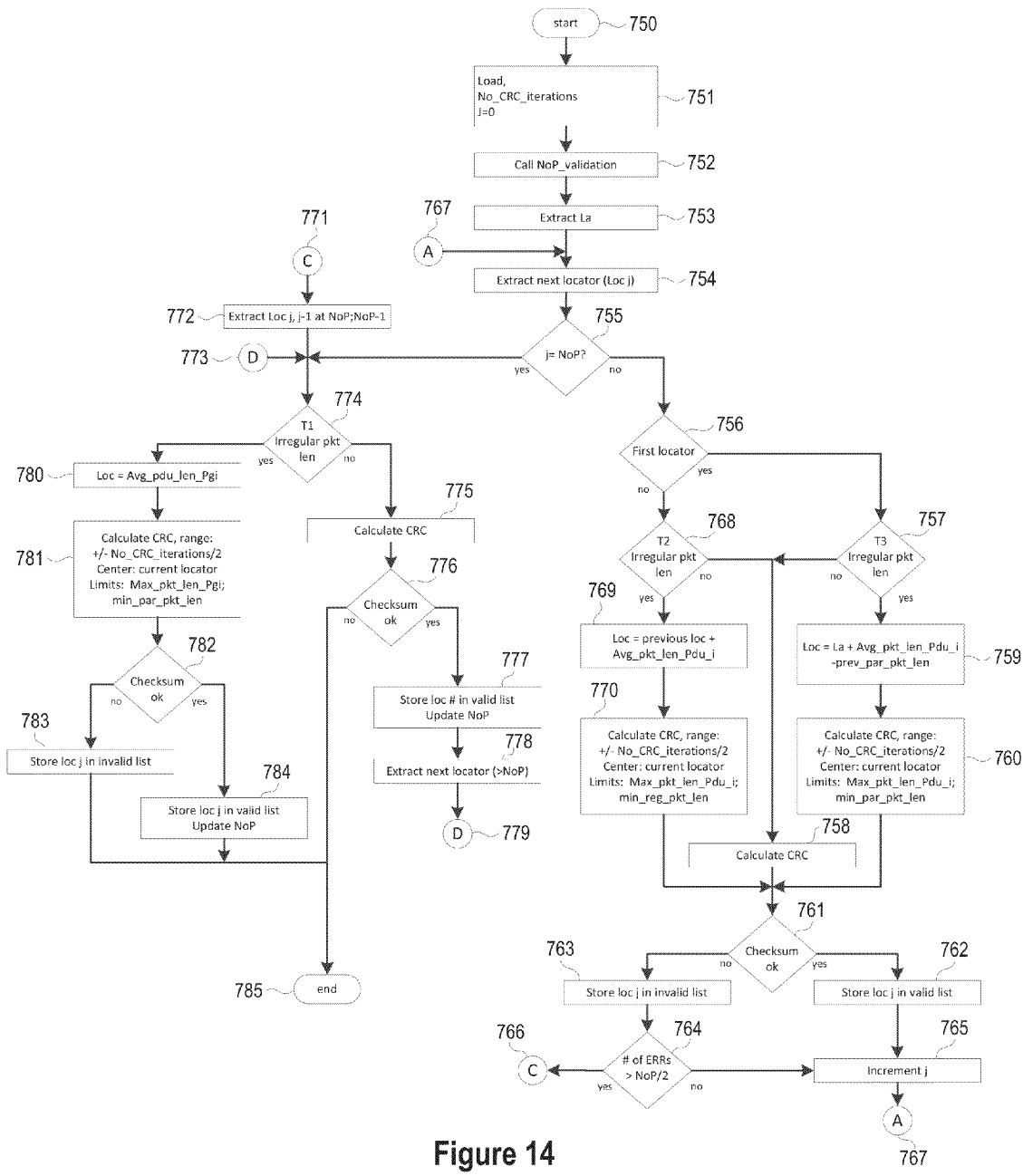
FIG. 14 illustrates an exemplary packet locator field recovery process in which selected signal parameters are used to recover audio packet location fields from a received PDU signal frame header in which there are detected errors in the header or within individual packets of the signal frame.

Referring now to FIG. 14, there are illustrated selected embodiments of a packet locator field recovery process which is invoked upon failure to detect the PDU header. As described more fully below, selected signal parameters are used to recover audio packet location fields from a received PDU header from signal frame in which there are detected errors in the header and potentially within individual packets of the signal frame. In particular, each locator (e.g., La 725, Loc 0 712, Loc 1 713, . . . , Loc NOP-1 714) is extracted from its expected placement in the PDU header, and the packet length for the corresponding packet is examined for validity using one of a set of packet validity tests, depending on the projected location of the tested packet. When the packet validity test indicates that the packet length is valid (though not necessarily correct), the regular packet CRC calculation is performed on the packet based on its assumed packet length. However, when the packet validity test indicates that the packet length is clearly invalid, its projected value is calculated based on the available packet and PDU statistics, and a broad range of CRC calculations is applied over a broad range of estimated packet lengths, The calculations range is determined by the processing configuration, and can be done either dynamically or statically. When the number of unrecovered locators exceeds a certain threshold (e.g., NoP/2), the locator recovery process may skip further recovery attempts, except of the last locator which is used to perform a boundary location recovery process.

Once the process begins (at step 750), one or more configurable computational boundary parameters may be set and/or loaded at step 751 to define the header recovery process in terms of the computation resources to be used, For example, a first boundary parameter (e.g., No_CRC_iterations) may be loaded which limits the number of CRC iterations used when performing CRC calculations for an uncertain audio packet length (i.e., due to locator uncertainty) as described hereinbelow. In general terms, the computational boundary parameters loaded at step 751 may be used to control the use of computational resources (e.g., memory and/or processor resources) so that the packet locator field recovery process may be throttled dynamically or configured statically within a specific implementation and/or at a specific time. In addition, the locator number is set to (i.e., j=0).

At step 752, a validation process is applied to the Number of Packets (NoP) information extracted from the header (e.g., from header byte 4 724 in the PDU control word 711). When called, the validation process verifies the validity of the NoP in order to search for a known number of locators. When no sufficient information regarding the past and next PDU of the same program is available, the NoP can only be checked for proper bounds but not for accuracy, so the process does not assume its correctness, While the relatively short NoP value has a relatively low likelihood of experiencing errors (as compared to possible errors in the audio packet location fields 712-714), the NoP validity check step 752 is still performed in order to assist the content recover), process described hereinbelow. In selected embodiments, the validity check step 752 validates that the NoP is within the min/max boundaries, based on the PDU type. For short PDUs, the min/max boundaries may range from 3 to 8. And for long PDUs, the min/max boundaries may range from 24 to 41. In cases where sufficient header information of the past and next consecutive PDUs for the same program is available and considered error-free, joint information may be used to extract and validate the NoP. In such cases, the difference between the extracted packet sequence numbers should match the current NoP and partial packet indications, In the event that the NoP validity check step fails or otherwise may not be fully checked due to insufficient information, a long-term average of the number of packets may be used to set the NoP value. For example, the long-term average+1 number can be used to set the NoP. In other embodiments, the long-term average+1 for short PDUs/packets is set to a first value (e.g., 5) and is set to a second value (e.g., 33) for long PDUs/packets.

At step 753, the location of the beginning of the audio packets is extracted from the current PDU header. This location corresponds to the location of the last byte of the program service data (PSD) field (e.g., 702, 716), and is included in the PDU control word (e.g., 711) at header byte 5 (725) which stores the "La" value as location relative to the first byte (header byte 0) of the PDU control word.

At step 754, the next locator (i.e., Loc j) is extracted from the current PDU header. As will be appreciated, locator extractor step 754 may begin by extracting the first locator (e.g., Loc 0 712) from the PDU control word (e.g., 711) using it in conjunction with the extracted "La" location value during a first iterative pass, as the first packet (packet 0) data is located between La and Loc 0. With each iterative pass, the next locator is extracted by incrementing j for extracting the "Loc j" value until the NoP value is reached (i.e., j has reached NoP−1), as the jth packet (packet i) data is located between Loc j−1 and Loc j.

At the first iterative pass, the last field locator detection step 755 determines that the last field locator (LocNOP−1) is not being processed (negative outcome to detection step 755) and the first field locator detection step 756 determines that the first field locator (Loc0) is being processed (affirmative outcome to detection step 756). At this point, the packet length for the first packet (e.g., Packet 0) corresponding to the first field locator (e.g., Loc0) is examined for validity at step 757 by applying a first packet validity test (T3) to assess the first packet length against selected parameters relating to minimum, maximum, and/or average packet length, partial packet length, or PDU length. In an example implementation illustrated with reference to FIG. 15, the first packet validity test T3 (793) is retrieved from stored validity test code database 790. Upon execution, the first packet validity test T3 (793) determines if the packet length for the first packet is larger than the maximum packet length for the selected program (Pg i) or if the packet length for the first packet is shorter than the minimum partial packet length for the selected program (Pg i). As expressed with the example coding script 793, the first packet validity test T3 (793) defines the two disqualifying boundary conditions as follows: (1) "Loc_0−La>max_pkt_len_Pgi" and (2) "Loc_0−La<min_par_pkt_len." So long as neither boundary condition is true (negative outcome to detection step 757), then the packet length for the first packet (e.g., Packet 0) is valid (though not necessarily correct), and a CRC calculation is performed on the first packet at step 758. Based on the calculated CRC value for the first packet (e.g., Packet 0), the first field locator (e.g., Loc0) is stored in a list of valid location fields or a list of invalid location fields. For example, if the calculated CRC value for the first packet passes a checksum match test at step 761 thus determined to be valid (affirmative outcome to checksum step 761), then the first field locator (e.g., Loc0) is stored in the valid list (at step 762). On the other hand, if the calculated CRC value for the first packet does not pass the checksum match test at step 761 (negative outcome to checksum step 761), then the first field locator (e.g., Loc0) is stored in the invalid list (at step 763).

Referring back to the first packet validity test step 757, if either boundary condition from the first packet validity test T3 is true (affirmative outcome to detection step 757), then the packet length for the first packet (e.g., Packet 0) is treated as an irregular or invalid packet length. In this case, a projected packet location value (Loc) for the first packet is calculated based on available PDU statistics and/or selected parameters relating to minimum, maximum, and/or average packet length, partial packet length, or PDU length. For example, an initial location value (Loc) for the first packet may be computed at step 759 by starting with the "La" value extracted at step 753, adding the average packet length value for the selected PDU (Avg_pkt_len_PDUi), and subtracting the previous partial packet length value (prev_par_pkt_len), as extracted or recovered while processing the previous PDU for the same program (Pgi). Based on the computed initial location value (Loc), one or more CRC values may be calculated over a range of values centered around the computed initial location value (Loc) at step 760. In the example shown in FIG. 14, the CRC values calculated at step 760 are computed over a range of values by using the computed initial location value (Loc) as a center point, and then iteratively calculating one or more CRC computational iterations (e.g., +/−No_CRC_iterations/2) to compute CRC values within pre-defined limits, such as the maximum packet length (Max_pkt_len_PDUi) or the minimum partial packet length (min_par_pkt_len). In this way, the CRC calculation range is determined by the processing configuration parameters, and can be done either dynamically or statically. Upon computing the CRC values from the projected packet lengths at step 760, the computed CRC values are evaluated (at step 761). If one of the calculated CRC values passes the checksum matching test, then the corresponding (i.e. adjusted within the search range) recovered locator value is stored in the list of valid fields (step 762) and the count value "j" is incremented (step 765). If none of the calculated CRC values passes the checksum matching test then the extracted locator (Loc 0) is stored in the list of invalid location fields (step 763).

As part of the packet locator field recovery process, the number of unrecovered or invalid locators may be monitored or tracked so as to discontinue the process if there are excessive numbers of unrecovered locators. For example, a locator failure count (# of ERRs) is evaluated at step 764 against a specified threshold (e.g., NoP/2) to determine if the locator recovery process should be stopped. At the first iterative pass, the threshold-based process discontinuation is not likely to occur (negative outcome to step 764), in which case the locator index is incremented (step 765) and the recovery process returns to step 754 (as indicated by connection node A 767) to extract the next locator. However, during a subsequent iterative pass when the threshold is reached (affirmative outcome to step 764), the locator recovery process may skip or discontinue further recovery attempts within the current PDU, subject to any additional processing required to perform a PDU boundary location recovery process as indicated by the connection node C (766).

During any subsequent iterative pass, the "next" locator is extracted from its expected header location and evaluated against predetermined packet validity test criteria. For example, when the last field locator detection step 755 determines that the last field locator (LocNOP−1) is not being processed (negative outcome to detection step 755) and the first field locator detection step 756 determines that the first field locator (Loc0) is not being processed (negative outcome to detection step 756), then the field recovery process is being applied to one of the intermediate packet field locators. At this point, the packet length for the intermediate packet (e.g., Packet 1, 2 and so on, but not packet 0 and not packet NoP−1) corresponding to the intermediate field locator (e.g., Loc 1) is examined for validity at step 768 by applying a second packet validity test to assess the intermediate packet length against selected parameters relating to minimum, maximum, and/or average packet length, partial packet length, or PDU length, in an example implementation illustrated with reference to FIG. 15, the second packet validity test T2 (792) is retrieved from stored validity test code database 790. Upon execution, the second packet validity test T2 (792) determines if the packet locator for the intermediate packet is larger than the maximum PDU length for the selected program (Pg i) or if the packet length for the intermediate packet is larger than the maximum regular packet length for the selected program (Pg i) or if the packet length for the intermediate packet is shorter than the minimum regular packet length for the selected program (Pg i). As expressed with the example coding script 792, the intermediate packet validity test T2 (792) defines the three disqualifying boundary conditions as follows: (1) "Loc_j>max_pdu_len_PDUi" and "Loc_j-Loc_j−1>max_pkt_len_Pgi." and "Loc_j-Loc_j−1<min_reg_pkt_len." So long as neither boundary condition is true (negative outcome to detection step 768), then the packet length for the intermediate packet (e.g., Packet 1) is valid (though not necessarily correct), and a CRC calculation is performed on that intermediate packet at step 758, and processing continues with steps 761-767 as described hereinabove.

On the other hand, if either boundary condition from the intermediate packet validity test T2 is true (affirmative outcome to detection step 768), then the packet length for the intermediate packet is treated as an irregular or invalid packet length. In this case, a projected packet location value (Loc) for the intermediate packet is calculated based on available PDU statistics and/or selected parameters relating to minimum, maximum, and/or average packet length, partial packet length, or PDU length. For example, an intermediate location value (Loc) for the intermediate packet may be computed at step 769 by starting with the previously computed location value (e.g., computed at step 759 or computed at the previous iteration of step 769 or remained unmodified but examined in step 758) and adding the average packet length value for the selected PDU (Avg_pkt_len_PDUi), Based on the computed intermediate location value (Loc), one or more CRC values may be calculated over a range of locator values centered around the computed intermediate location value (Loc) at step 770. In the example shown in FIG. 14, the CRC values calculated at step 770 are computed over a range of values by using the computed intermediate location value (Loc) as a center point, and then iteratively calculating one or more CRC computational iterations (e.g., +/−No_CRC_iterations/2) to compute CRC values within pre-defined limits, such as the maximum packet length (Max_pkt_len_PDUi) or the minimum regular packet length (min_reg_pkt_len). In this way, the CRC calculation range is determined by the processing configuration parameters (e.g., No_CRC_iterations), and can be done either dynamically or statically. Upon computing the CRC values from the projected packet lengths at step 770, the computed CRC values are evaluated (at step 761) to determine if any of them passes checksum matching. Then if one passes checksum matching, the corresponding locator is stored in the valid list (step 762). If no CRC value passes checksum matching, then the computed locator (Loc) in step 769 is stored in the list of valid or invalid location fields (steps 763).

Unless and until the locator failure count (# of ERRs) meets or exceeds the specified threshold (e.g., NoP/2), the iterative process continues to extract the "next" locator from its expected header location until the last locator is extracted. For example, when the last field locator detection step 755 determines that the last field locator (LocNOP−1) is being processed (affirmative outcome to detection step 755), then the packet length for the last packet (e.g., Packet NOP−1) corresponding to the last field locator (e.g., Loc NOP−1) is examined for validity at step 774 by applying a third packet validity test to assess the last packet length against selected parameters relating to minimum, maximum, and/or average packet length, partial packet length, or PDU length. As shown in FIG. 14, the third packet validity test (791) is applied in step 774 to the last packet, even when the threshold number of locator recovery failures has been met. This is indicated by the connection node C (771) and the associated locator extraction step 772 for extracting the last locator (NoP) and next-to-last locator (NOP−1). FIG. 14 also shows that the third packet validity test 791 in step 774 is applied to any additional locators that are extracted past the NoP value, as indicated by the connection node D (773, 779) and the associated locator extraction step 778.

Figure 15:
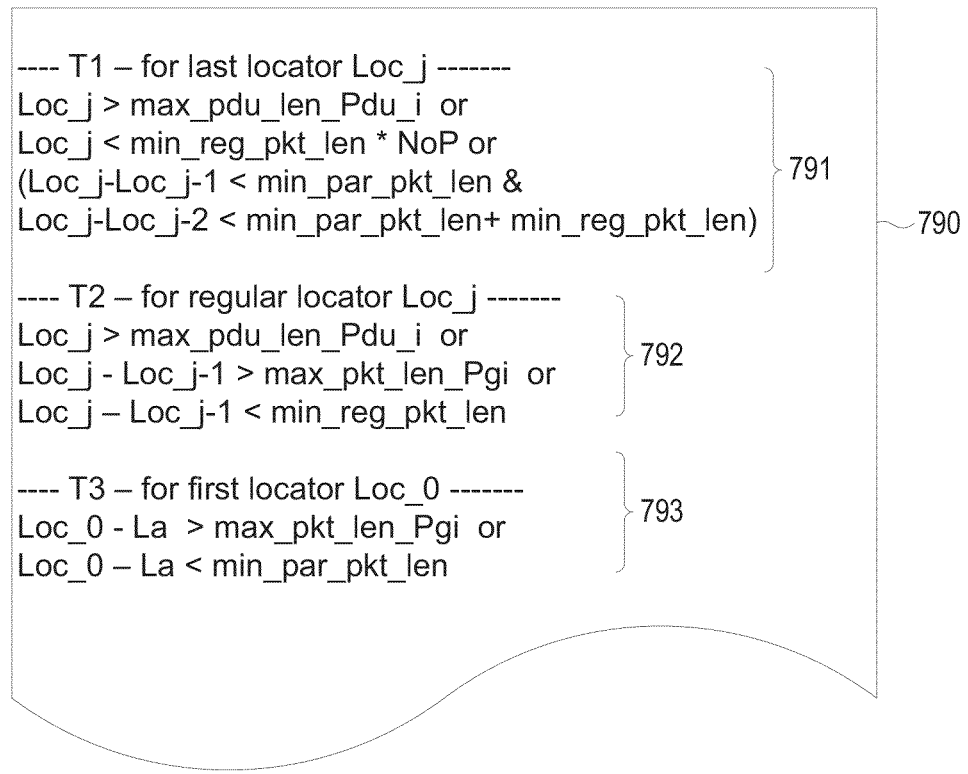
FIG. 15 illustrates exemplary packet validity tests which may be applied to detect irregular or invalid audio packet lengths in a received digital radio broadcast signal in accordance with selected embodiments.

In an example implementation illustrated with reference to FIG. 15, the third packet validity test T1 (791) is retrieved from stored validity test code database 790 and executed to determine if the locator points to a location that is larger than the maximum PDU length for the selected program (Pg i) or if it points to a location that is lesser than the minimum regular packet length multiplied by the NoP value for the selected program (Pg i). As expressed with the example coding script 791, the last packet validity test T1 (791) defines the two disqualifying boundary conditions as follows: (1) "Loc_j>max_pdu_len_PDUi" and "Loc_j<min_reg_pkt_len*NoP." In other embodiments, the validity of the last packet length may be evaluated by determining that (1) the last packet length is smaller than the minimum partial packet length, while at the same time the sum of the last packet length and the next to last packet length is smaller than the sum of the minimum partial packet length and minimum regular packet length. As expressed with the example coding script 791, this alternative statement of the last packet validity test T1 (791)

defines the disqualifying conditions as follows: "(Loc_j-Loc_j−1<min_par_pkt_len & Loc_j-Loc_j−2<min_par_pkt_len+min_reg_pkt_len)." Regardless of how the disqualifying conditions of the third packet validity test are defined, so long as the disqualifying conditions are not met (negative outcome to failure detection step 774), then the packet length for the last packet (e.g., Packet NOP−1) is valid (though not necessarily correct), and a CRC calculation is performed on the last packet at step 775. If the calculated CRC values for the last packet pass a checksum matching test at step 776, the last field locator is stored in a list of valid location fields at step 777 (including any required update of the NoP value), and an assumed additional locator is extracted at step 778. In addition, with a successful CRC calculation result (affirmative outcome to step 776), it is assumed that the current NoP may not be the actual NoP, and one more locator is extracted from the projected locator placement at step 778 before the process returns to apply the last packet validity test step 774 to the new locator (via connection D). On the other hand, if the calculated CRC value for the last packet does not pass the checksum matching test (negative outcome to checksum step 776), then the last field locator is evaluated to determine if this is the last PDU in the L2/L4 transfer frame (as described more fully in FIG. 16).

Referring back to the last packet validity test step 774, if the disqualifying conditions are true (affirmative outcome to detection step 774), then the packet length for the last packet (e.g., Packet NOP−1) is treated as an irregular or invalid packet length. In this case, a projected packet location value (Loc) for the last packet is calculated based on available PDU statistics and/or selected parameters relating to minimum, maximum, and/or average packet length, partial packet length, or PDU length. For example, a location value (Loc) for the last packet may be computed at step 780 using the average PDU length value (Avg_pdu_len_Pgi) for the selected program (Pgi) which is carried/served by that PDU. Based on the computed location value (Loc) from step 780, one or more CRC values may be calculated over a range of values centered around the computed location value (Loc) at step 781. In the example shown in FIG. 14, the CRC values calculated at step 781 are computed over a range of values by using the computed location value (Loc) as a center point, and then iteratively calculating one or more CRC computational iterations (e.g., +/−No_CRC_iterations/2) to compute CRC values within pre-defined limits, such as the maximum packet length (Max_pkt_len_Pgi) or the minimum partial packet length (min_par_pkt_len). In this way, the CRC calculation range is determined dynamically or statically using selected processing configuration parameters (e.g., No_CRC_iterations). Upon computing the CRC value from the projected packet length at step 781, the computed CRC value is evaluated (at step 782) to determine whether the last locator is stored in the list of valid or invalid location fields. In particular, a checksum matching failure for all the last packet calculations (negative outcome to step 782) means that the last locator (Loc) as computed in step 780 is stored in the invalid list at step 784. However, if one of the last packet CRC calculations passes the checksum matching test (affirmative outcome to step 782), then the computed last locator corresponding to that successful calculation is stored in the valid list step 784, and any required update of the NoP value is performed.

As seen from the foregoing, the recovery process 771-785 for the last locator in the PDU differs from the recovery processes for other locators in the same PDU since the last locator may also point to the boundary of the current PDU and therefore to the next (adjacent) PDU within the same transfer frame. Accordingly and as indicated by connection node C (766, 771), the recovery process attempts to recover the PDU boundary, regardless of its success or failure in recovering the intermediate locators of the POLL The last locator recovery process is also set up to start from the currently assumed NoP and to continue extracting additional "last" locators. For example, if the last packet length is valid (not necessarily correct) (negative outcome to step 774), then packet CRC is calculated once at step 775, in order to limit processing resources, If the CRC calculation results in success (affirmative outcome to step 776), then the current packet is stored in the valid list (step 777). In addition, it is assumed that the current NoP may not be the actual NoP, so one more locator is extracted from the projected locator placement (step 778). The process continues iteratively (via feedback connection node D 779, 773) until CRC calculations fail (negative outcome to step 776), and the entire locator recovery process ends (step 785).

Figure 16:
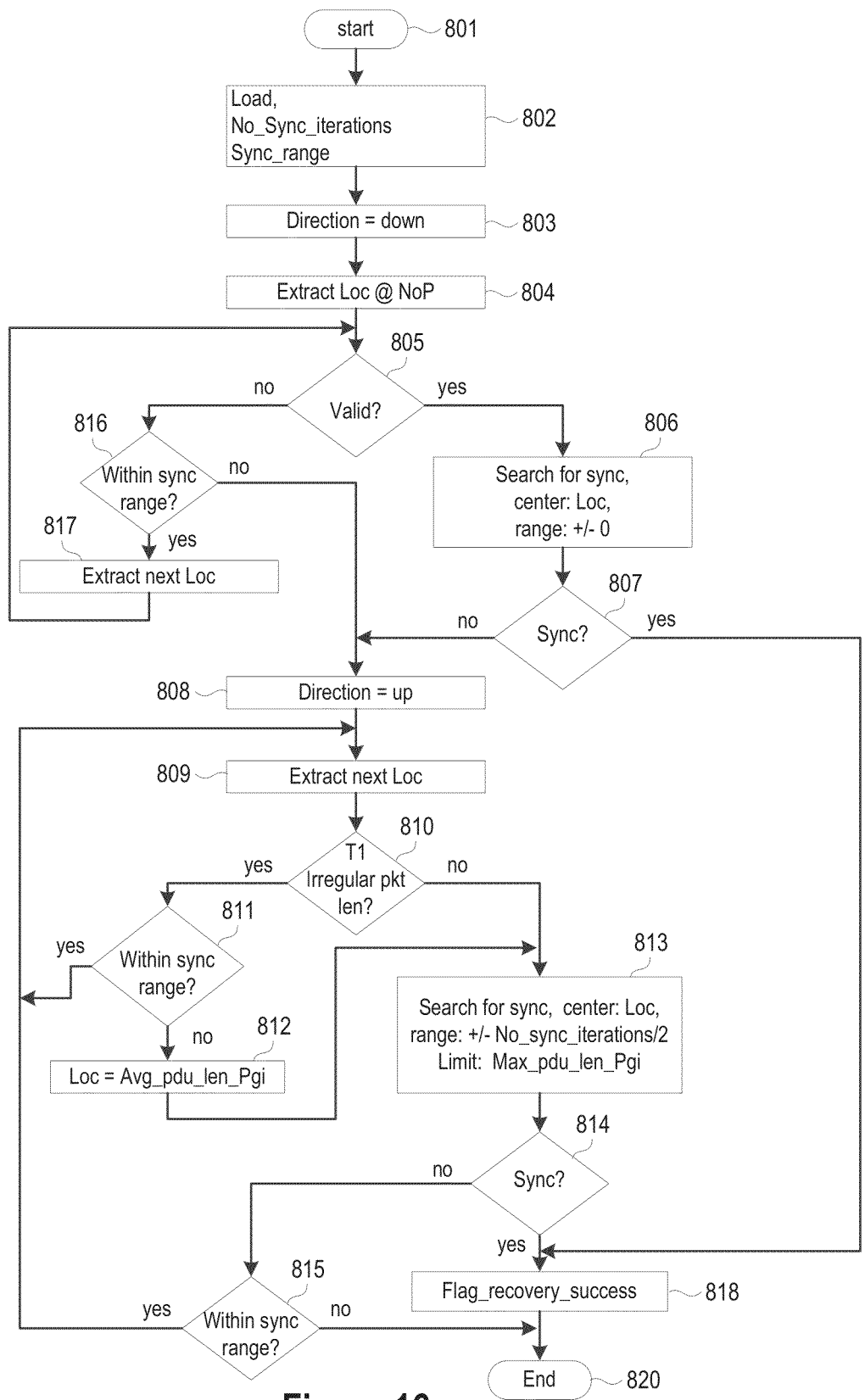
FIG. 16 illustrates an exemplary PDU boundary recovery process in which selected signal parameters are used to recover a predetermined PDU synchronization pattern in one or more subsequent PDU signal frames.

To illustrate further details concerning the PDU boundary recovery process, reference is now made to FIG. 16 which shows an exemplary PDU boundary recovery process, attempting to recover the boundary between PDUi and PDUi+1, in which selected signal parameters are used to recover a predetermined PDU synchronization pattern in one or more subsequent PDUs signal frames contained within a transfer frame, The boundary recovery process of FIG. 16 may be used to implement step 744 from FIG. 13, and is based on the known placement (but not specific boundary location) of one or more adjacent PDU headers in a transfer frame that contains multiple PDUs representing multiple audio programs transported within a single transfer frame. When the disclosed PDU boundary recovery process starts (at step 801), the last locator of the preceding PDUi (i.e. adjacent PDU which is placed before the current PDUi+1 within the same transfer frame) is assumed to be the most recently updated NoP value from the packet locator field recovery process shown in FIG. 15.

At step 802, one or more configurable computational boundary parameters may be set and/or loaded to define the boundary recovery process in terms of the computation resources to be used, For example, a first boundary parameter (e.g., No_Sync_iterations) may be loaded which limits the number of sync pattern computations used when searching for the predetermined PDU synchronization pattern as described hereinbelow. In addition or in the alternative, a second boundary parameter (e.g., Sync_range) may be loaded which limits the range for extracting or computing location fields used in the sync pattern search process as described hereinbelow.

The sync search process begins by searching for the last (highest) verified locator, starting at the last locator for the preceding PDU i, and then proceeds backward through the previous locators (before NoP) in PDU i within defined search boundaries. In particular, the sync pattern search direction is set to "down" (at step 803) and the sync search process then extracts the last locator from the header of PDU i (at step 804).

At step 805, the sync search process checks to see if the last locator is on the "valid" list of locators. If the extracted locator (NOP) is on the "valid" list (affirmative outcome to step 805), then the PDU boundary recovery process begins searching for the predetermined PDUi+1 sync pattern (at step 806). In the example shown in FIG. 16, the sync pattern search uses the extracted location value (Loc) as a center point, and then searches for the predetermined PDUi+1 sync pattern using a precise search (e.g., search range=+/−0). While any desired sync pattern may be used in the search, in selected embodiments, the sync pattern looks for predetermined bits from the header of the next PDU i+1 that are quasi-static or otherwise change only when a program is added. For example, the sync pattern may be defined with control word bits 24 thru 47, and bit 16 which are located in header byte 0 (720), header byte 1 (721), header byte 2 (722), and the least significant bit from header byte 3 (723). If the search step 806 finds the sync pattern (affirmative outcome to detection step 807), the synchronization is successful, and the process ends with the exact pointer to the PDU boundary so that the PDU boundary between PDUi and PDUi+1 is recovered, a recovery flag is set (step 818) and the process ends (step 820). In selected embodiments, the sync pattern search step 807 uses a predetermined threshold or percentage measure to determine success of the search. For example, a specified correlation threshold may be applied to define a successful sync search when a specified percentage of the sync pattern is matched (e.g., a match of 22 or more, out of 25 sync pattern bits).

Referring back to step 805, if the extracted locator is not on the "valid" list of locators (negative outcome to step 805), then the last locator from PDU i is not valid. In this case, the sync search process goes back through the PDU i by one locator at a time to determine if the next to be used as last locator is within a defined sync range parameter ("Sync_range") at step 816. If the next to be used as last locator was within the defined sync range (affirmative outcome to step 816), then that next (previous) locator is extracted from the PDU i (at step 817) and evaluated against the "valid" list (at step 805). This process is repeated to find a verified locator for so long as the locator extraction process is contained within the defined sync range limit.

If no verified locators are found within the defined sync range below NoP (negative outcome to step 816) or if the synchronization step 806 fails (negative outcome in step 807), then the sync search process begins searching in the reverse direction when the sync pattern search direction is set to "up" (at step 808). In this direction, the sync search process sequentially extracts each locator (step 809) and then verifies the packet length (at step 810). In an example implementation illustrated with reference to FIG. 15, packet length is verified by retrieving and executing the third packet validity test T1 (791) from a stored validity test code database 790 which defines disqualifying conditions for the packet length in terms of selected PDU parameters relating to minimum, maximum, and average packet length or PDU length to extract locator information from an expected placement in the PDU header.

If the disqualifying conditions at step 810 are not met (negative outcome to failure detection step 810), then the packet length validity is verified, and the sync search process begins performing broad sync calculations (at step 813). In this case, in the example shown in FIG. 16, the sync pattern search performed at step 813 is performed over a range of values by using the last extracted locator (i.e. extracted Loc) as a center point, and then iteratively performing one or more search iterations (e.g., +/−No_Sync_iterations/2) to find the sync pattern values within pre-defined limits, such as the maximum packet length (Max_pkt_len_PDUi). If the search step 813 finds the sync pattern (affirmative outcome to detection step 814), the synchronization is successful as signaled with the setting of a successful recovery flag (step 818). At this point, the process has generated the exact pointer to the PDU boundary so that the PDU boundary is recovered, and the process ends (step 820). However, if the search step 813 does not find the sync pattern (negative outcome to detection step 814), the search process determines if the last locator is within a defined sync range parameter ("Sync_range") at step 815. In the case where no synchronization is achieved (negative outcome to step 814) and the sync search process reaches the sync range limit above NoP (negative outcome to step 815), the process ends at step 815.

If the disqualifying conditions at step 810 are met (affirmative outcome to failure detection step 810), the sync search process goes forward through the PDU i by one locator at a time to locate a verified locator that is within the defined sync range. For example, if the last locator was within the defined sync range (affirmative outcome to step 811), then the next (subsequent) locator is extracted (at step 809) and the corresponding packet length is verified by retrieving and executing the third packet validity test T1 (at step 810). This process is repeated to find a verified packet length for so long as the search process is contained within the defined sync range limit. However, in the case where no valid packet length is encountered (negative outcome to step 810) and synchronization is not achieved while reaching the sync range above NoP (negative outcome to step 811), the locator is set to the average PDU length for that program (Pgi) (step 812) and the sync pattern search is performed at step 813 over a range of values, using the locator setting in step 812 as a center point.

As will be appreciated, the disclosed method and receiver apparatus for processing a composite digital radio broadcast signal and programmed functionality disclosed herein may be embodied in hardware, processing circuitry, software (including hut is not limited to firmware, resident software, microcode, etc.), or in some combination thereof, including a computer program product accessible from a computer-usable or computer-readable medium providing program code, executable instructions, and/or data for use by or in connection with a computer or any instruction execution system, where a computer-usable or computer readable medium can be any apparatus that may include or store the program for use by or in connection with the instruction execution system, apparatus, or device. Examples of a non-transitory computer-readable medium include a semiconductor or solid state memory, magnetic tape, memory card, a removable computer diskette, a random access memory (RAM), a read-only memory (ROM), a rigid magnetic disk and an optical disk, such as a compact disk-read only memory (CD-ROM), compact disk-read/write (CD-R/W) and DVD, or any other suitable memory.

By now it should be appreciated that there is provided herein a digital radio broadcast receiver for an in-band on-channel HD radio broadcast signal and associated processor-implemented method of operation for processing a composite digital radio broadcast signal to recover audio transport elements, In selected embodiments, the receiver includes at least one recordable storage medium having stored thereon executable instructions and data which, when executed by at least one processing device, cause the at least one processing device to process a composite digital radio broadcast signal to recover audio transport elements as described herein, in other embodiments, the receiver is embodied as an article of manufacture having a computer readable storage medium with computer program instructions adapted to cause a processing system to process a composite digital radio broadcast signal to recover audio transport elements as described herein. As disclosed, a composite digital radio broadcast signal is received that includes one or more protocol data units (PDUs) transported together in a single transfer frame. A first header portion of a first PDU is processed to detect a header decoding failure. The processing of the first header portion may detect the header decoding failure by computing a cyclic redundancy check value associated with the first header portion. In the event of a header decoding failure, one or more valid and invalid audio packet location fields are identified in the first header portion of the first PDU using specified PDU length and packet length parameters for the first PDU to compute and correct audio packet location fields based on an expected placement of each extracted audio packet location field in the first header portion of the first PDU and one or more structural statistics for the first PDU. In selected embodiments, the valid and invalid audio packet location fields are identified by extracting a first audio packet location field from an expected location in the first header portion of the first PDU; applying a packet validity test to a first audio packet in the first PDU that corresponds to the first audio packet location field; calculating a cyclic redundancy check value based on whether or not the first audio packet passes the packet validity test; and identifying the first audio packet location field as either a valid or invalid audio packet location field based on whether the calculated cyclic redundancy check value matches. The calculation of the cyclic redundancy check value may be implemented by calculating a first cyclic redundancy check value based on a packet length of the first audio packet if the first audio packet passes the packet validity test; and calculating a plurality of cyclic redundancy check values over a specified range based on one or more packet and PDU statistics if the first audio packet does not pass the packet validity test. In addition, a PDU boundary between the first PDU and a second consecutive PDU from the transfer frame may be identified by using an audio packet location field extracted from the first header portion of the first PDU to define a search for a predetermined sync pattern in the second consecutive PDU. The search for the predetermined sync pattern in the second consecutive PDU may be performed within a specified sync range boundary around the audio packet location field to look for a plurality of quasi-static elements in the first header portion of the first PDU which change only when a program is added. For example, the predetermined sync pattern may include index bits 24 thru 47 and bit 16 in a PDU control word of the first header.

Although the described exemplary embodiments disclosed herein are directed to an exemplary IBOC system for using a plurality of predetermined signal parameters to efficiently recover or salvage audio transport elements (e.g., audio packet location fields and/or frame boundary information) from a received digital radio broadcast signal frame, present invention is not necessarily limited to the example embodiments which illustrate inventive aspects of the present invention that are applicable to a wide variety of digital radio broadcast receiver designs and/or operations. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A processor-implemented method for processing a composite digital radio broadcast signal to recover audio transport elements, comprising:
   receiving a composite digital radio broadcast signal comprising one or more protocol data units (PDUs) transported together in a single transfer frame;
   detecting a header decoding failure in a first header portion of a first PDU; and
   identifying valid and invalid audio packet location fields in the first header portion of the first PDU to locate one or more audio packets in the first PDU based on an expected placement of each audio packet location field in the first header portion of the first PDU and one or more structural statistics for the first PDU.

2. The processor-implemented method of claim 1, where receiving the composite digital radio broadcast signal comprises receiving an over-the-air in-band on-channel HD Radio broadcast signal.

3. The processor-implemented method of claim 1, where detecting the header decoding failure in the first header portion of the first PDU comprises computing a cyclic redundancy check value associated with the first header portion to detect a header decoding failure.

4. The processor-implemented method of claim 1, where identifying valid and invalid audio packet location fields comprises:
   extracting a first audio packet location field from an expected location in the first header portion of the first PDU;
   applying a packet validity test to a first audio packet in the first PDU that corresponds to the first audio packet location field;
   calculating one or more cyclic redundancy check values based on whether or not the first audio packet passes the packet validity test; and
   identifying the first audio packet location field as either a valid or invalid audio packet location field based on whether the calculated one or more cyclic redundancy check values matches.

5. The processor-implemented method of claim 4, where calculating one or more cyclic redundancy check values comprises:
   calculating a first cyclic redundancy check value based on a packet length of the first audio packet if the first audio packet passes the packet validity test; and
   calculating a plurality of cyclic redundancy check values over a specified range based on one or more packet and PDU statistics if the first audio packet does not pass the packet validity test.

6. The processor-implemented method of claim 1, further comprising identifying a PDU boundary between the first PDU and a second consecutive PDU from the transfer frame by using an audio packet location field extracted from the first header portion of the first PDU to define a search for a predetermined sync pattern in the second consecutive PDU.

7. The processor-implemented method of claim 6, where the search for the predetermined sync pattern in the second consecutive PDU is performed within a specified sync range boundary around the audio packet location field.

8. The processor-implemented of claim 6, where the predetermined sync pattern comprises a plurality of quasi-static elements in the first header portion of the first PDU which change only when a program is added.

9. The processor-implemented of claim 6, where the predetermined sync pattern comprises index bits 24 thru 47 and bit 16 in a PDU control word of the first header.

10. A digital radio broadcast receiver comprising at least one recordable storage medium having stored thereon executable instructions and data which, when executed by at least one processing device, cause the at least one processing device to process a composite digital radio broadcast signal to recover audio transport elements by:
    receiving a composite digital radio broadcast signal comprising one or more protocol data units (PDUs) transported together in a single transfer frame;

detecting a header decoding failure in a first header portion of a first PDU; and identifying valid and invalid audio packet location fields in the first header portion of the first PDU to locate one or more audio packets in the first PDU based on an expected placement of each audio packet location field in the first header portion of the first PDU.

11. The digital radio broadcast receiver of claim 10 wherein the executable instructions and data, when executed by at least one processing device, cause the at least one processing device to receive the composite digital radio broadcast signal by receiving an over-the-air in-band on-channel digital radio broadcast signal.

12. The digital radio broadcast receiver of claim 10 wherein the executable instructions and data, when executed by at least one processing device, cause the at least one processing device to detect the header decoding failure in the first header portion of the first PDU by computing one or more cyclic redundancy check values associated with the first header portion to detect a header decoding failure.

13. The digital radio broadcast receiver of claim 10 wherein the executable instructions and data, when executed by at least one processing device, cause the at least one processing device to identify valid and invalid audio packet location fields by:

extracting a first audio packet location field from an expected location in the first header portion of the first PDU;

applying a packet validity test to a first audio packet in the first PDU that corresponds to the first audio packet location field;

calculating one or more cyclic redundancy check values based on whether or not the first audio packet passes the packet validity test; and identifying the first audio packet location field as either a valid or invalid audio packet location field based on whether the one or more calculated cyclic redundancy check values matches.

14. The digital radio broadcast receiver of claim 13, wherein the executable instructions and data, when executed by at least one processing device, cause the at least one processing device to calculate the one or more cyclic redundancy check values by:

calculating a first cyclic redundancy check value based on a packet length of the first audio packet if the first audio packet passes the packet validity test; and calculating a plurality of cyclic redundancy check values over a specified range based on one or more packet and PDU statistics if the first audio packet does not pass the packet validity test.

15. The digital radio broadcast receiver of claim 10 further comprising executable instructions and data which cause the at least one processing device to process the composite digital radio broadcast signal to recover audio transport elements by identifying a PDU boundary between the first PDU and a second consecutive PDU from the transfer frame by using an audio packet location field extracted from the first header portion of the first PDU to define a search for a predetermined sync pattern in the second consecutive PDU.

16. The digital radio broadcast receiver of claim 15 wherein the executable instructions and data, when executed by at least one processing device, cause the at least one processing device to search for the predetermined sync pattern in the second consecutive PDU within a specified sync range boundary around the audio packet location field.

17. The digital radio broadcast receiver of claim 15 where the predetermined sync pattern comprises index bits 24 thru 47 and bit 16 in a PDU control word of the first header.

18. An article of manufacture comprising a computer readable storage medium having computer program instructions adapted to cause a processing system to:

control reception of a composite digital radio broadcast signal comprising one or more protocol data units (PDUs) transported together in a single transfer frame;

detect a header decoding failure in a first header portion of a first PDU; and identify valid and invalid audio packet location fields in the first header portion of the first PDU to locate one or more audio packets in the first PDU based on an expected placement of each audio packet location field in the first header portion of the first PDU.

19. The article of manufacture of claim 18, where the composite digital radio broadcast signal is received as an over-the-air in-band on-channel digital radio broadcast signal.

20. The article of manufacture of claim 18, where the header decoding failure is detected by computing a cyclic redundancy check value associated with the first header portion to detect a header decoding failure.

21. The article of manufacture of claim 18, where valid and invalid audio packet location fields are identified by:

extracting a first audio packet location field from an expected location in the first header portion of the first PDU;

applying a packet validity test to a first audio packet in the first PDU that corresponds to the first audio packet location field;

calculating one or more cyclic redundancy check values based on whether or not the first audio packet passes the packet validity test; and identifying the first audio packet location field as either a valid or invalid audio packet location field based on whether the one or more calculated cyclic redundancy check values matches.

22. The article of manufacture of claim 21, where calculating the one or more cyclic redundancy check values comprises:

calculating a first cyclic redundancy check value based on a packet length of the first audio packet if the first audio packet passes the packet validity test; and calculating a plurality of cyclic redundancy check values over a specified range based on one or more packet and PDU statistics if the first audio packet does not pass the packet validity test.

23. The article of manufacture of claim 18, wherein the computer program instructions are further adapted to cause the processing system to identify a PDU boundary between the first PDU and a second consecutive PDU from the transfer frame by using an audio packet location field extracted from the first header portion of the first PDU to define a search for a predetermined sync pattern in the second consecutive PDU.

24. The article of manufacture of claim 23, where the search for the predetermined sync pattern in the second consecutive PDU is performed within a specified sync range boundary around the audio packet location field.

25. The article of manufacture of claim 23, where the predetermined sync pattern comprises a plurality of quasi-static elements in the first header portion of the first PDU which change only when a program is added.

26. The article of manufacture of claim 23, where the predetermined sync pattern comprises index bits 24 thru 47 and bit 16 in a PDU control word of the first header.

* * * * *